(12) United States Patent
Singh et al.

(10) Patent No.: US 12,307,620 B2
(45) Date of Patent: May 20, 2025

(54) OBJECT DEFORMATION WITH BINDINGS AND DEFORMERS INTERPOLATED FROM KEY POSES

(71) Applicant: Unity Technologies SF, San Francisco, CA (US)

(72) Inventors: Karan Singh, Toronto (CA); Byung Kuk Choi, Wellington (NZ)

(73) Assignee: Unity Technologies SF, San Francisco, CA (US)

( * ) Notice: Subject to any disclaimer, the term of this patent is extended or adjusted under 35 U.S.C. 154(b) by 136 days.

(21) Appl. No.: 18/061,397

(22) Filed: Dec. 2, 2022

(65) Prior Publication Data

US 2023/0196702 A1    Jun. 22, 2023

Related U.S. Application Data

(60) Provisional application No. 63/318,745, filed on Mar. 10, 2022, provisional application No. 63/290,994, filed on Dec. 17, 2021.

(51) Int. Cl.
| | |
|---|---|
| *G06T 19/20* | (2011.01) |
| *G06T 7/70* | (2017.01) |
| *G06T 13/40* | (2011.01) |
| *G06T 17/20* | (2006.01) |

(52) U.S. Cl.
CPC ............ *G06T 19/20* (2013.01); *G06T 7/70* (2017.01); *G06T 13/40* (2013.01); *G06T 17/20* (2013.01); *G06T 2200/24* (2013.01); *G06T 2207/10028* (2013.01); *G06T 2219/2021* (2013.01)

(58) Field of Classification Search
None
See application file for complete search history.

(56) References Cited

U.S. PATENT DOCUMENTS

| | | | | |
|---|---|---|---|---|
| 4,600,919 A | * | 7/1986 | Stern | G06T 13/40 |
| | | | | 345/475 |
| 5,854,634 A | * | 12/1998 | Kroitor | G06T 13/00 |
| | | | | 345/473 |
| 6,108,011 A | * | 8/2000 | Fowler | G06T 13/20 |
| | | | | 345/441 |
| 8,970,628 B1 | * | 3/2015 | Jensen | G06T 19/20 |
| | | | | 345/647 |
| 11,074,738 B1 | * | 7/2021 | Stevenson | G06T 19/20 |
| 2006/0033740 A1 | * | 2/2006 | Tooley | G06T 13/40 |
| | | | | 345/473 |
| 2014/0198106 A1 | * | 7/2014 | Sumner | G06T 13/40 |
| | | | | 345/473 |

\* cited by examiner

*Primary Examiner* — Jason A Pringle-Parker
(74) *Attorney, Agent, or Firm* — Haynes and Boone, LLP

(57) ABSTRACT

An image generation system defines a set of deformation handles having an associated set of one or more control parameters, obtains a set of object points representative of a virtual object, maps the set of object points to a plurality of key pose states, wherein the key pose state is represented by a key pose state data structure corresponding to a key pose that specifies control parameters to place the set of the deformation handles to coincide with the set of object points, determines corresponding key pose state data structures, receives a set of deformations to be applied to the set of deformation handles, interpolates poses among an interpolated key pose state set to form a current pose state based on the set of deformations, and adjusts the virtual object based on the interpolated key pose state set.

19 Claims, 13 Drawing Sheets

A. Deformer (Wire/Cluster)   B. Multipose Slip = 0.1   C. Multipose Slip = 1

5

6

A. Multipose Slip = 0.1     B. Multipose Slip = 1

1

2

3

4

5

OBJECT DEFORMATION WITH BINDINGS AND DEFORMERS INTERPOLATED FROM KEY POSES

CROSS-REFERENCES TO PRIORITY AND RELATED APPLICATIONS

This application is a non-provisional of, and claims the benefit of and priority from, U.S. Provisional Patent Application 63/318,745 filed Mar. 10, 2022, entitled "Object Deformation with Bindings and Deformers Interpolated from Key Poses."

This application is a non-provisional of, and claims the benefit of and priority from, U.S. Provisional Patent Application 63/290,994 filed Dec. 17, 2022, entitled "DEFORMING POINTS IN SPACE USING A CURVE DEFORMER."

This application incorporates by reference U.S. patent application Ser. No. 18/074,008 filed Dec. 2, 2022, entitled "DEFORMING POINTS IN SPACE USING A CURVE DEFORMER".

The entire disclosures of the applications recited above are hereby incorporated by reference, as if set forth in full in this document, for all purposes.

FIELD

The present disclosure generally relates to specifying object shapes for computer-generated imagery computation and for other purposes, and more particularly to tools used to manipulate and/or specify deformations of objects.

BACKGROUND

Computer-generated imagery, such as images or video sequences, might be generated by a renderer that takes as an input geometric models of objects, lighting, features, virtual camera position, positions of elements within a virtual scene space, etc. and outputs one or more images, which might be represented as arrays of pixels each having an assigned pixel color. In a more general case, pixels might be assigned values other than color values.

Some of the objects might be simple shapes. For example, an artist can "place" a sphere into a virtual scene space by inputting nothing more than a virtual scene space coordinate of a center of the sphere and a radius of the sphere in the units of a coordinate system of the virtual scene space, along with perhaps a color or a texture for the surface of the sphere. However, for more complicated objects, such as a stylized dog, an artist might have to specify many more details. For an arbitrary object that can be placed in a virtual scene and has a surface that can be defined, it might be that there are an intractable number of degrees of freedom of the object. For example, if a surface of an object, such as a character in an animated movie, is defined by a set of vertices and edges connecting vertices, forming a mesh, or collection of curves or parameters that define a surface of the character, specifying the shape of the surface of that character could be done by specifying coordinate positions of thousands or millions of vertices in a mesh. While many examples of a surface definition are in the form of a set of vertices, each located within a coordinate system of a virtual space, and a set of edges between vertices that together form a surface, another representation defining a surface might be used instead, such as a set of points and relationships among the points.

One solution to the intractability of individually specifying millions of positions of vertices of a mesh is to use deformation handles. In the context of a virtual object having some surface, a deformation handle might provide a few degrees of freedom for an artist (or other user) to specify and thus modify a large number of vertex positions. For example, if a deformation handle is a point that is deemed to be "attached" or bound to a vertex of a nose of a character, a virtual object manipulation system might be programmed to determine how the artist moves the deformation handle (such as by moving a cursor on an interactive display) and to revise the shape of the character such that the nose remains attached to the character's face but stretches so that the vertex of the nose moves with the deformation handle as the artist moves the deformation handle.

In general, transforming an object based on artist inputs (which could be from an animation artist, from a person not regularly considered an artist, or a computer program or process) into a transformed object might be referred to as a "deformation" of the object.

More generally, an object can be some three-dimensional ("3D") geometry. Computer systems that are used for deforming 3D geometry based on artist inputs can be deployed in the modeling and animation of objects in computer graphics ("CG"). For a rigid, stationary object, transformations might be easily specified. For example, an artist can specify how to move a virtual solid rock from one place in a virtual scene to another place in a virtual scene by specifying a 3D translation vector and values for two degrees of rotational freedom. For a simple stick figure, an artist can move an arm just by specifying a change to an elbow joint angle. But for more complicated structures, more than just a few parameters would need to be specified.

Most organic or natural objects are neither rigid in construction nor in motion and often it is desirable to have realistic deformations. For example, if a character's face is deformed to move its mouth from a neutral position to a smiling position, it might be desirable to also thicken the cheeks, as that happens on a real person's face when smiling Granted, an artist can specify how the corners of the character's mouth moves, then specify all the changes of cheek surface, lip surface, eye wrinkles, etc.

To address this, computer graphics systems that take inputs for object deformation might be programmed to have a way for an artist or software developer to specify deformation handles. In the general case, a deformation is a mapping of points on a surface of a starting object or geometric shape to points of a deformed object or deformed geometric shape. For example, to rigidly move an object to the right by one unit in a virtual space, each point on the starting object might map to a point (on the deformed object) that is one unit to the right of that point.

A spatial, surface-agnostic deformation specifies deformation of each point independent of other points, whereas a surface-aware deformation specifies deformations wherein a deformation of a point might take into account local properties or global properties of the surface. The deformation of points from a starting state to a deformed state might be representable by a functional mapping of points to points in the virtual space. Examples of spatial, surface-agnostic deformations might include squashes/stretches, twists, tapers as described in [B84], free-form deformations based on lattices as described in [SP86] and [C90], cages as described in [J+07], point curves as described in [J+11], wire curves as described in [SF98], surface wrap proxies as described in [SK00], etc. Brush-based sculpting, such as that provided in Zbrush tools, can be used for interactive modeling using deformation.

A surface-aware deformation might take into account local or global properties of the geometry being deformed to additionally inform deformation mapping of points on the geometry, such as that described in [BS08]. A simple example of a locally surface-aware deformation could be to deform each surface point by moving it a specified distance along a surface normal at the point being moved. An example of a global surface-aware deformation might be to uniformly scale a closed object so that its overall volume equals a specified value.

Other deformation tools and algorithms for modeling and animation of 3D objects might provide for intuitive deformation handles for artists where handle manipulation results in minimal and smooth deformation over artist-controlled regions of the object. Examples might be shown in [B84], [SP86], [SF98], [SK00], [J+07], and/or [J+11]. In some approaches, a reference deformation handle is associated with the undeformed object in some spatial configuration. Manipulation of the handle relative to this reference causes the object to deform commensurate to the geometric change in the handle. More than one handle can be provided. In any case, a typical goal is to provide an interface and/or inputs that allow for specification of a deformation where the specification has many fewer degrees of freedom than the deformation.

With fewer degrees of freedom, it might be that the range of changes to a deformation handle maps to deformations that are not ideal or desired. Improved tools can provide for simpler input of desired deformations.

The following references might be referred to elsewhere herein and might be relevant to the disclosures herein:

[A+04] Angelidis, A., Cani, M.-P., Wyvill, G., and King, S., "*Swirling-sweepers: Constant-volume modeling*", Pacific Graphics 2004, IEEE, 10:15 (2004).

[A+04II] Angelidis, A., Wyvill, G., and Cani, M.-P. 2004, "*Sweepers: Swept user-defined tools for modeling by deformation*", Proceedings of Shape Modeling and Applications, IEEE, 63:73 (2004).

[AS07] Angelidis, A. and Singh, K., "*Kinodynamic skinning using volume-preserving deformations*", Proceedings of the ACM SIGGRAPH/Eurographics Symposium on Computer Animation (SCA '07) (2007).

[B+97] Bajaj, C., Blinn, J., Bloomenthal, J., Cani-Gascuel, M.-P., Rockwood, A., Wyvill, B., and Wyvill, G., "*Introduction to Implicit Surfaces*", Morgan-Kaufmann (1997).

[B84] Barr, A., "Global and Local Deformations of Solid Primitives", ACM Trans. Graph. (Proc. of SIGGRAPH '84), 21:30 (1984).

[B+13] Bassett, K., Baran, I., Schmid, J., Gross, M., Sumner, R. W., "*Authoring and animating painterly characters*", ACM Transactions on Graphics (TOG) 32 (5), 1-12 (2013).

[BS08] Botsch, M., and Sorkine, O., "*On linear variational surface deformation methods*", IEEE Trans. Vis. Comp. Graph. 14, 1, 213-230 (2008).

[C90] Coquillart, S., "*Extended free-form deformation: A sculpturing tool for 3d geometric modeling*", Proceedings of SIGGRAPH '90, ACM Press/ACM SIGGRAPH, vol. 24(4) of Computer Graphics Proceedings, Annual Conference Series, ACM, 187:195 (1990).

[I+05] Igarashi, T., Moscovich, T., Hughes, J. F., "*Spatial Keyframing for Performance-driven Animation*", ACM SIGGRAPH/Eurographics Symposium on Computer Animation (2005).

[J+11] Jacobson, A, Baran, I., Popović, J., and Sorkine, O., "*Bounded biharmonic weights for real-time deformation*", ACM Trans. Graph. 30, 4, Article 78 (July 2011).

[J16] Jacobson, A., "*Boolean Operations using Generalized Winding Numbers*", arXiv preprint arXiv:1601.07953 (2016).

[J+07] Joshi, P., Meyer, M., DeRose, T., Green, B., and Sanocki, T., "*Harmonic coordinates for character articulation*", ACM Trans. Graph. 26, 3 (July 2007).

[M+03] Meyer, M., Desbrun, M., Schroder, P., and Barr, A. H., "*Discrete Differential-Geometry Operators for Triangulated 2-Manifolds*", Visualization and Mathematics III. 35-57 (2003).

[SP86] Sederberg, T., and Parry, S., "*Free-form deformation of solid geometric models*", Proceedings of SIGGRAPH '86, ACM Press/ACM SIGGRAPH, vol. 20(4) of Computer Graphics Proceedings, Annual Conference Series, ACM, 151:160 (1986).

[SF98] Singh, K., and Fiume, E., "*Wires: a geometric deformation technique*", Proceedings of SIGGRAPH '98, ACM Press/ACM SIGGRAPH, Computer Graphics Proceedings, Annual Conference Series, ACM, 405:414 (1998).

[SK00] Singh, K., and Kokkevis, E., "*Skinning Characters using Surface Oriented Free-Form Deformations*", Graphics Interface, 35:42 (2000).

[vF06] von Funck, W., Theisel, H., and Seidel, H. P., "*Vector field based shape deformations*", ACM Trans. Graph. 25, 3, 1118-1125 (July 2006).

[W09] Williams, R., "*The Animator's Survival Kit—Revised Edition: A Manual of Methods, Principles and Formulas for Classical, Computer, Games, Stop Motion and Internet Animators*", Faber & Faber, Inc. (2009).

SUMMARY

An image generation system defines a set of deformation handles having an associated set of one or more control parameters, obtains a set of object points representative of a virtual object, maps the set of object points to a plurality of key pose states, wherein the key pose state is represented by a key pose state data structure corresponding to a key pose that specifies control parameters to place the set of the deformation handles to coincide with the set of object points, determines corresponding key pose state data structures, receives a set of deformations to be applied to the set of deformation handles, interpolates poses among an interpolated key pose state set to form a current pose state based on the set of deformations, and adjusts the virtual object based on the interpolated key pose state set.

In a more general case, the key pose state data structure specifies a set of pose parameters, some of which might be deformation handles and some of which might be control parameters determined by placement or other configuration of deformation handles. The set of pose parameters is a set of parameters with typically many fewer degrees of freedom than the set of object points that are given position or other values based on the pose parameters. Deformation handles might coincide with the set of object points, but in some implementations, the deformation handles are not so limited.

In examples here, in a simple case, a pose is defined by a single deformation handle and a single control parameter of that deformation handle, where the single control parameter is a position in the virtual space of the single deformation handle. In various implementations, there might be many deformation handles and more than one control parameter for a given deformation handle. In an example, there might be a pose defined by a set of pose parameters. An object can be deformed from a reference pose based on the set of pose parameters. Given two or more key poses, each of which has a set of pose parameters and a set of object points for the key pose, the object would be deformed (or the set of object points changed or set) to a state based on the key pose.

As used herein, a pose might be described or defined by its set of pose parameters, pp. The set of pose parameters pp might be represented in computer memory by a data structure that can be manipulated by computer processes and instructions described herein. For example, a graphics processing system with a user interface, or not, might be programmed to take as input a set of pose parameters and process imagery or user interaction as described by some of the mathematical expressions explained herein. The set of pose parameters might include parameters specific to some deformation handles as well as some additional parameters that are not specific to individual deformation handles. For example, a set of pose parameters might define parameters for several deformation handles and for each of those deformation handles include parameters representing a deformation handle type, a deformation handle position, a deformation handle translation, a deformation handle orientation, a deformation handle fall-off range parameter, and a deformation handle logic data field that might define logic as to how changes in the deformation handle affect changes in the object or define an algorithm or series of steps for changing an object based on changes in the deformation handle. There might be additional pose parameters, such as a general fall-off range parameter, that are not specific to particular deformation handle and yet are part of the pose in that changes to those additional pose parameters can change the state of the object having that pose.

The example of a deformation handle might be a cluster as depicted in various figures using crosshairs that a user can translate, rotate, etc. using a user interface. Another example of a deformation handle might be a wire curve where the deformation handle parameters include a deformation handle type, a curve, possibly a parametric curve, a deformation handle fall off range parameter, and other parameters. In a specific example, an object might be an articulated character having a rig or skeleton and the set of pose parameters, pp, for the object and pp has data indicating how each of the joints are deformed.

An object might have a pose and together those can define a state of the object (shape or other state of a set of object points) as can be represented in computer memory by data corresponding to that state. For example, an object that is in a key pose, $k_i$, where key pose $k_i$ is defined by a set of pose parameters $pp_i$ can be said to have a state $o_i$. Accordingly, in a key pose $k_1$ defined by a set of pose parameters $pp_1$, the object might have a shape $o_1$, while in a key pose $k_2$ defined by a set of pose parameters $pp_2$, the object might have a shape $o_2$, etc. Given an input set of current pose parameters, $pp_c$, which define a current pose, the state/shape of the object, $o_c$, for the object in the current pose could be calculated by determining an interpolating weight, W, which might be between 0.0 and 1.0, where W is determined from $pp_c$, $pp_1$, and $pp_2$, then $o_c$ might be computed by a graphics system to be equal to $(W)(o_1)+(1-W)(o_2)$. Where more than two key poses are interpolated from, a set of weights could be calculated that would weight the object states and the weights determined from the current pose's set of pose parameters and the sets of pose parameters for each of the key poses that are interpolated among.

This Summary is provided to introduce a selection of concepts in a simplified form that are further described below in the Detailed Description. This Summary is not intended to identify key features or essential features of the claimed subject matter, nor is it intended to limit the scope of the claimed subject matter. A more extensive presentation of features, details, utilities, and advantages of the methods, as defined in the claims, is provided in the following written description of various implementations of the disclosure and illustrated in the accompanying drawings.

BRIEF DESCRIPTION OF THE DRAWINGS

Various implementations in accordance with the present disclosure will be described with reference to the drawings, in which:

FIG. 4 comprises FIGS. 4A, 4B, and 4C.

FIG. 5 comprises FIGS. 5A and 5B.

DETAILED DESCRIPTION

Figure 1:
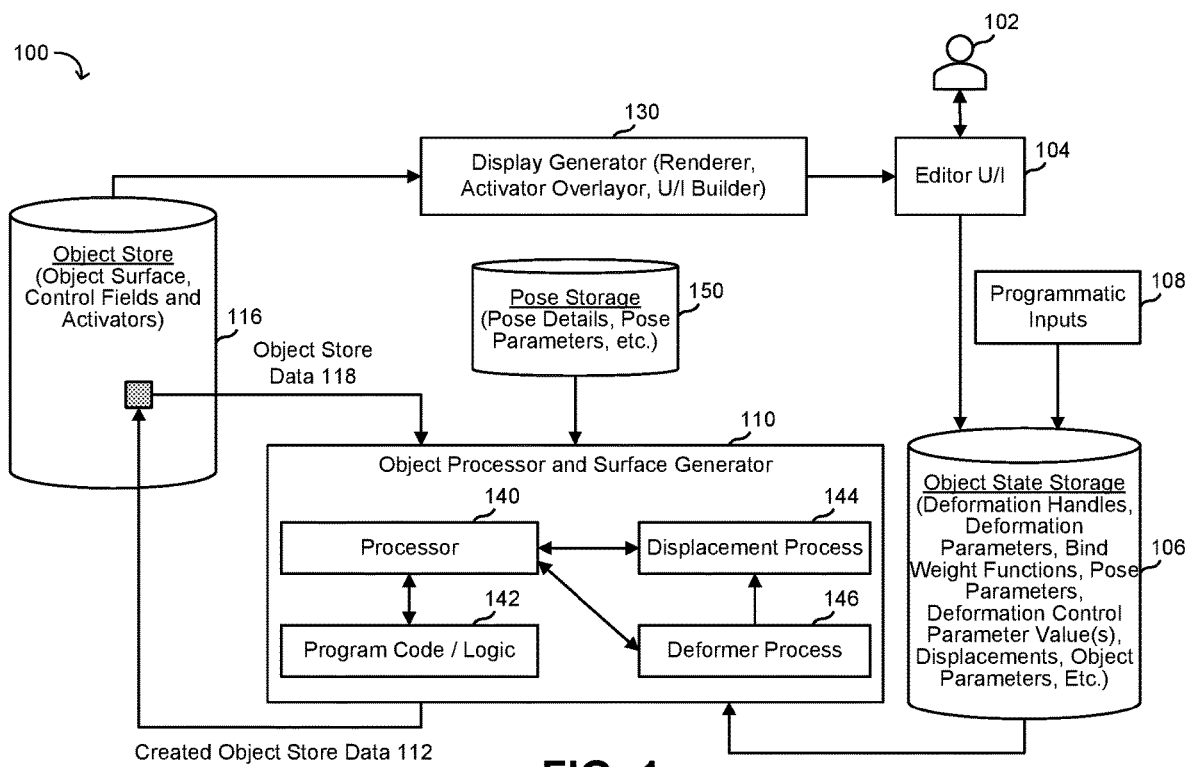
FIG. 1 illustrates a block diagram of an image editing system that can be used for editing virtual objects.

In the following description, various implementations will be described. For purposes of explanation, specific configurations and details are set forth in order to provide a thorough understanding of the implementations. However, it will also be apparent to one skilled in the art that the implementations may be practiced without the specific details. Furthermore, well-known features may be omitted or simplified in order not to obscure the implementation being described.

An image editing system, or more generally, a graphical editing system, comprising a processor and a non-transitory computer memory storing instructions for that includes a deformer might present a view of an object to a user and accept inputs that specify a deformation of the object. Deformation of an object might be represented in computer memory as changes of positions of points on a surface of the object as between a starting, undeformed, or original object to a deformed object. The object might represent a real-world object, a fanciful object, etc. that might only exist as a virtual object that can be processed and manipulated by a computer system such as a simulation system or a CGI generation system for imagery such as images or video. The deformation could be applied to a surface of an object, a surface that is not explicitly associated with a virtual object, or other geometric shape or surface, which might be representable in an N-dimensional virtual space, typically a 3D virtual space. The original surface and/or the deformed surface can then be used for CGI generation, for input to a simulation system, input to a lighting system, or other purposes.

An image editing system can be an improvement over other computer systems that modify data representing an object, shape or surface at least in that deformations that are more likely of interest can be more easily input via a user interface, or more efficiently and/or usefully represented in memory. For example, where a surface of an object is represented by thousands of mesh vertices, it can be impractical to individually specify changes of positions, difficult to represent the changes in usable form, and complicated to edit a deformation. Being able to represent in computer memory certain deformations having fewer degrees of freedom can simplify inputs, representations of changes in memory, and editing. Thus, instead of having to deal with moving around thousands of points individually, a deformation can be specified by a movement of a deformation handle. In a specific example, an image editing system processes a surface and accepts a deformation parameter that represents how much stretching is to be applied to the surface. If a user can input a value for the deformation parameter, the image editing system can output a representation of the object deformed according to the deformation parameter.

Maya™ animation software is an example of a tool that can be used for deformations. With the Maya tool, an animator is presented with a view of an object's surface. The animator can then use various input controls to specify a deformation. For example, the object might be defined with reference to a rig or skeleton and the deformation inputs represent changes to joint angles, which in turn would result in deformations of the object's surface. Other tools might be used to specify deformations.

A particular image editing system might allow for editing of virtual objects by editing a set of object points representative of a virtual object. In practice, typically, the number of object points is large enough that an editor would prefer not to edit them each individually, although the image editing system might allow for an editor to modify one or more of the object points individually. As an example, an animated character might be constructed of a mesh having millions of vertices and an editor might want to edit with fewer degrees of freedom than three degrees of freedom times the number of vertices. In the examples herein an editor (human, computer, programmatic, etc.) modifies values for object points and the examples are that the values are positions in a three-dimensional (3D) virtual space and editing moves points or adds or removes them. The values can also be other than positions, but for clarity of exposition, many examples of editing are editing of object point positions. The object points can be other than points on a surface of the object, such as points relative to a surface of the virtual object, such as points on a level set of the coordinate system relative to the surface of the virtual object, or points of a point cloud representing the virtual object, points of a mesh representing the virtual object, points of a non-uniform rational B-spline (NURBS) corresponding to a surface of the virtual object, or other object points, but for clarity of exposition, many examples herein are explained with respect to the object points being points on a surface of the virtual object and editing those object points is moving them about in the virtual space.

In many examples herein, the positions of the object points, and thus the shape and position of the surface of the virtual object, are determined based on deformations and displacements. Each of these can be represented by suitable data structures, such as those described herein. A specific example of deformations is an articulated character having a shape that varies according to deformations that correspond to changes in joint angles between rig elements, such as might correspond to a skeleton of the articulated character. In such an example, editing might involve setting joint angles of various joints of a rig, storing those joint angles in a data structure representing a pose of the articulated character and generating a surface shape of the articulated character.

A deformer might be specified by a deformation handle, one or more control parameters, and a bind weight function. The deformation handle represents what an editor can manipulate, control parameters correspond to values of how the editor manipulates the deformation handle, and the bind weight function indicates effects of the control parameter changes on the set of object points. For example, an articulated character might have a "elbow" deformation, usable for an editor to control the bending of the articulated character's elbow. The deformation handle might be an icon or screen object that the editor moves about to change a control parameter that specifies an angle between the articulated character's upper arm and forearm. The bind weight function indicates how points on the surface of the articulated character move in the virtual space depending on the control parameter. In this example, there is only one control parameter—the angle of the elbow—but in other examples, there could be more than one control parameter. It might be that the bind weight function specifies that all of the points on the character's hand move through space to remain attached to the forearm and the forearm moves through space based on the angle, some of the skin near the elbow wrinkles in, and the bind weight function is zero everywhere beyond the shoulder, e.g., the leg surface does not change as the elbow deformer is manipulated.

A pose of an object can be represented in computer memory by a set of pose parameters that might be referred to and/or represented by a set of control parameter values for deformers in use and values for the corresponding set of object points of the object. Thus, when an object is in a particular pose and the object points are points on its surface, the points indicate the shape of the object. In the case of a humanoid character, the deformers might correspond to joints, the deformers' control parameter values might be joint angles, rotations, extensions, compressions, etc. and the object points can be used to depict the humanoid character in a particular pose. A key pose might be a pose that is usable as a base for deformation and/or displacement.

FIG. 1 illustrates a block diagram of an image editing system 100. Image editing system 100 can be used for editing virtual objects. In some implementations, image editing systems can be used for manipulating virtual objects that might be used for other purposes besides displaying images of the virtual object. As illustrated in FIG. 1, an editor 102, such as an animation artist or other user, might interact with image editing system 100 via an editor user interface 104 to modify data about a virtual object that can be stored in an object state storage 106. The data about virtual objects in object state storage 106 might also be edited by computer processes or other manner of programmatic inputs 108. The data about virtual objects that relate to the position of deformation handles, displacements, points of a virtual object, etc. might be expressed in a coordinate system for a virtual space, which might be some number of dimensions other than three dimensions, but is commonly a three-dimensional virtual space.

Data about a virtual object stored in an object state storage 106 might include details of deformers that are applicable to the virtual object, displacements applicable to the virtual object, object parameters, etc. For a given deformer, object state storage 106 might store data about a deformation handle, deformation parameters such as one or more control parameters of the deformer, bind weight functions applicable to the deformer, and values for the one or more control parameters. The data about a virtual object can be provided to an object processor 110 that can process a virtual object based on its state, such as applying a deformer process and a displacement process and outputting created object store data 112 to be stored in an object store 116. Object store 116 might include object's surface details, control fields, and activators for a virtual object. Such data can be provided to a display generator 130, which might include a renderer, an activator overlayor, and a user interface builder. Display generator 130 might generate an image of an object based on its stored object surface and insert activators into the image to indicate to editor 102 how deformers can be manipulated.

Object processor 110 might include a general-purpose processor 140 programmed according to the program code/logic 142 and might include a deformer process 146 and a displacement process 144. In some implementations, object processor 110 reads back object store data 118 from object store 116.

A pose storage 150 can provide pose details to object processor 110. A data structure for a pose might comprise, for each of multiple deformers, deformation control parameter values, bind weight functions, and a representative set of object points. This data structure might be referred to as a set of pose parameters. In a very specific example, a pose for a humanoid virtual character might be an array of joint angles and shape of the humanoid virtual character in a crouching pose, whereas another pose for the humanoid virtual character might be another array of joint angles for a standing pose and corresponding shape of the humanoid virtual character standing. Pose storage 150 might include storage for key poses, some of which might be a baseline or a starting state for editing a virtual object. Where a pose includes the representative set of object points, display generator 130 could obtain those points to generate an image for the editor.

For a deformer, a deformation handle might be defined and might be represented in editor user interface 104 as something that an editor can manipulate. In a specific example, a deformation handle is depicted by crosshairs, a circle icon, or another on-screen object. A pose state data structure can have stored values for control parameters of the associated set of one or more control parameters defines a pose state for the set of deformation handles. In some uses, a deformation handle represents a one-dimensional construct but in other uses, two-dimensional constructs, such as wires, might be used to specify a deformation.

For a key pose, pose storage 150 might maintain a mapping of the set of object points to a key pose state, wherein the key pose state is represented by a key pose state data structure corresponding to a key pose that specifies control parameters to place the set of the deformation handles to coincide with the set of object points. Object processor 110 might determine a plurality of key pose states and corresponding key pose state data structures, wherein the plurality of key pose states includes the key pose state represented by the key pose state data structure.

Object processor 110 might receive a set of deformations, such as in the form of changes to the deformation control parameter values to be applied to the set of deformation handles, and interpolate poses among an interpolated key pose state set, the interpolated key pose state set comprising at least two of the plurality of key pose states, to form a current pose state based on the set of deformations. From that, object processor 110 can adjust the virtual object based on the interpolated key pose state set.

A deformer might have an associated bind weight function value, the bind weight function indicative of changes to positions of points in the set of object points resulting in changes of the associated set of one or more control parameters.

Figure 2:
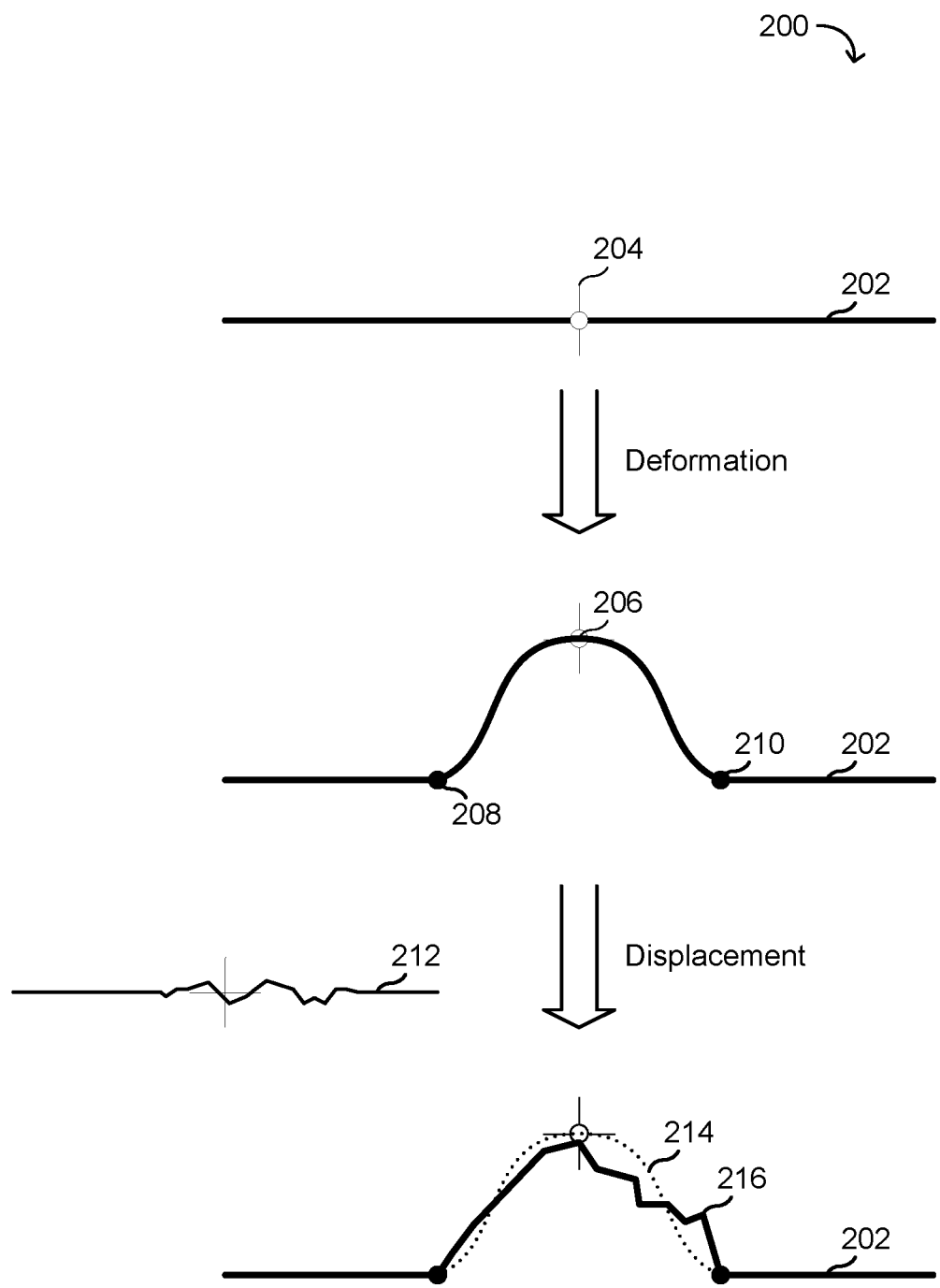
FIG. 2 illustrates an editing process depicted by displays.

FIG. 2 illustrates an editing process depicted by displays 200. For ease of explanation, extremely a simplified example is presented and it will be apparent how to apply this to more complicated objects upon reading this disclosure. At the top of FIG. 2, an object 202 is shown. In this illustration, object 202 is a planar object that is positioned in the plane that goes into, and comes out of, the page and as such is viewed edge on. Associated with object 202 is a single deformer and in a display of an editor user interface, a deformer handle 204 is displayed. In a deformation edit, deformer handle 204 moves to a new position 206. A bind weight function for the deformer is such that a point on object 202 that is coincident with deformer handle 204 remains coincident with deformer handle 204 as deformer handle 204 moves, while points nearby move as specified by the bind weight function. The movement of a given point on object 202 resulting from the movement of deformer handle 204 can be computed using the bind weight function. Where deformation results in movement of a specified number of points, the bind weight function might be represented by an array of weights corresponding to the specified number of points. In the example shown in FIG. 2, the bind weight function is zero to the left of point 208 and to the right of point 210.

In some editing operations, points on a surface of object 202 are displaced. A displacement pattern 212 might be applied to the deformed object to displays points aside from deformations. As illustrated in FIG. 2, an object shape 216 results from applying displacement pattern 212 to deformed curve 214.

Figure 3:
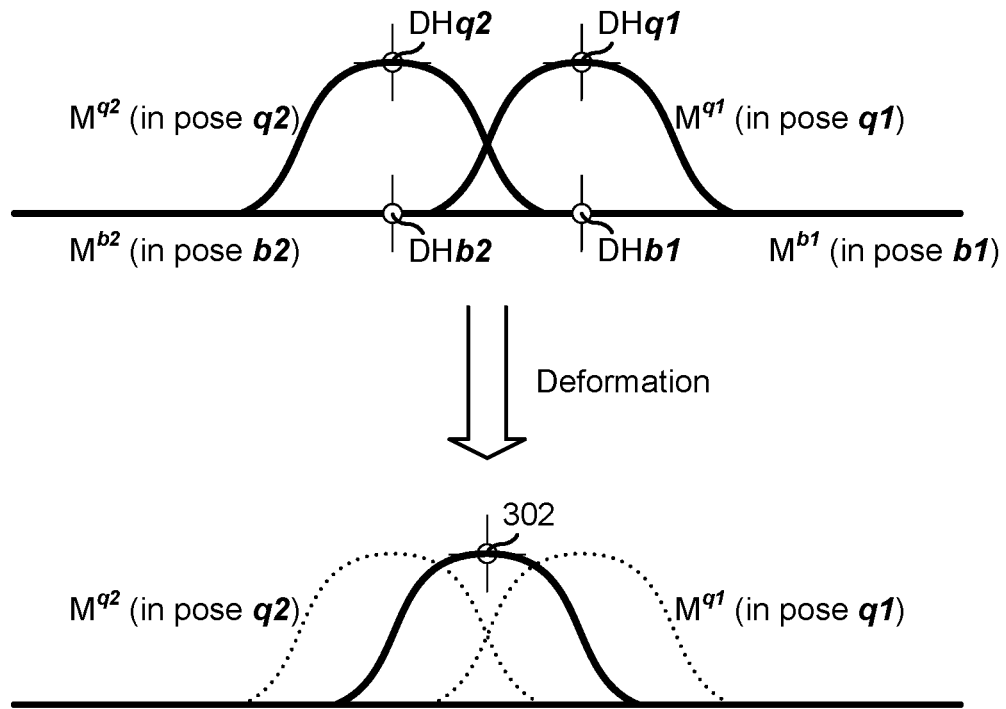
FIG. 3 illustrates poses as might be defined by values for deformer control parameter values and bind weight functions.

FIG. 3 illustrates two poses. As explained herein, a pose might be defined by a set of pose parameters that might comprise values for deformer control parameter values and bind weight functions. In this extremely simplified example, in a first pose, b1, object M is a planar object, $M^{b1}$, with a deformer having a deformer handle at point DHb1 as indicated. In a second pose, b2, object M is also a planar object, $M^{b2}$, but its deformer has a deformer handle at point DHb2 as indicated. Two other poses, q1 and q2, are shown. Pose q1 is a deformation of $M^{b1}$ by movement of the deformer handle to position DHq1, resulting in the shape $M^{q1}$. Pose q2 is a deformation of $M^{b2}$ by movement of the deformer handle to position DHq2, resulting in the shape $M^{q2}$.

As used herein, a data structure that represents a set of pose parameters might be referenced herein with bolded, lowercase, italicized labels and/or it should be apparent from context that a label is otherwise referring to a set of pose parameters. Likewise, a pose that is represented by, or defined by, a set of pose parameters might be in some places herein referenced with bolded, lowercase, italicized labels. In some places herein, vectors and points in an N-dimensional space are labeled with labels in lowercase bold, variables are referred to in UPPERCASE ITALICS, poses and sets of pose parameters are referred to in lowercase bold italics, indices (such as in summations) are indicated as single letter italics such as i, j, and k, and functions are referred to as in deform( ). Each of these elements can be instantiated as data structures readable from a memory, presented in a user interface, modified in some instances by a computer process, etc. depending on context.

One or more of the poses shown in FIG. 3 could be stored as key poses and serve as a starting point for deformation inputs from an editor. In the example shown, poses q1 and q2 can be stored as key poses. In the example deformation shown in FIG. 3, a deformation handle is moved to position 302. Based on that movement, an object processor might start with a key pose such as q1 and deform from that pose. While in this simple example, it might not matter whether the deformation is taken from q1 or from q2, in some cases it does.

Figure 4A:
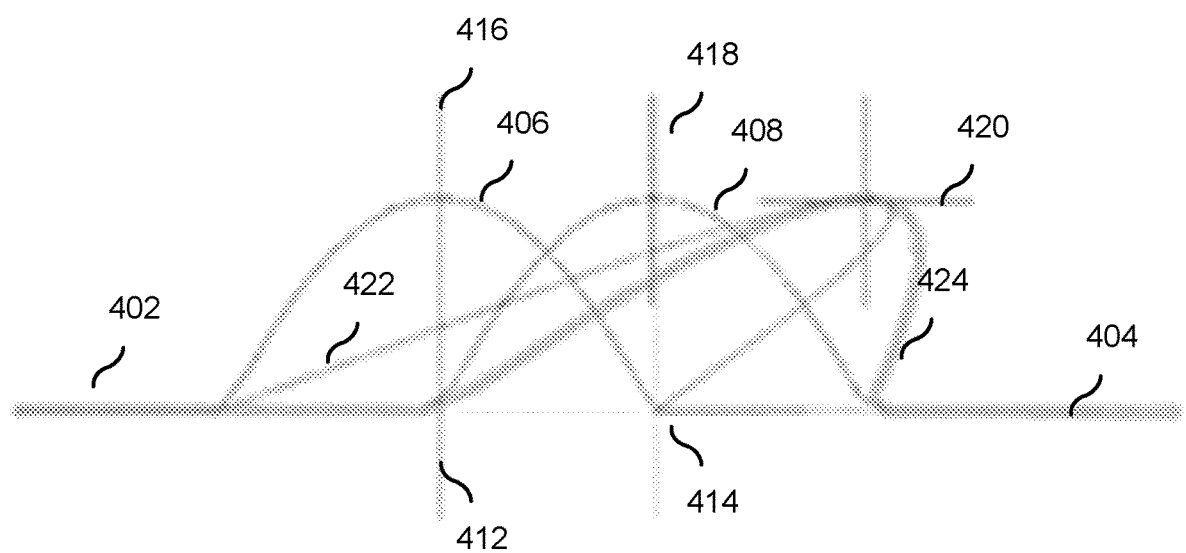
FIG. 4 illustrates some examples of how deformations might be performed by an object processor based on key poses, some of which are undesirable and some of which provide desired and/or expected results.

FIG. 4 illustrates some examples of how deformations might be performed by an object processor based on key poses, some of which are undesirable and some of which provide desired and/or expected results. In a user interface, these examples might be presented for display while an editor moves a deformation handle. As with FIGS. 2-3, a simple object viewed edge on is depicted, with various states. In each state, what is illustrated is the generated object shape given key pose 402 and key pose 404, both of which are planar objects into and out of the page, a corresponding deformed pose 406 that is a deformation of key pose 402, and a corresponding deformed pose 408 that is a deformation of key pose 404. Corresponding deformed pose 406 and corresponding deformed pose 408 could themselves be key poses as well. Each of the poses are relative to a corresponding deformation handle. In FIG. 4A, as shown, a deformation handle 412 is a deformation handle for key pose 402, a deformation handle 414 is a deformation handle for key pose 404, a deformation handle 416 is a deformation handle for corresponding deformed pose 406, and a deformation handle 418 is a deformation handle for corresponding deformed pose 408.

A deformation handle 420 might be a deformation handle manipulated by an editor, where an object shape 422 corresponds to a deformation of the object from pose 406 or 402, while an object shape 424 corresponds to a deformation of the object from pose 408 or 404. The examples are presented in FIG. 4B and FIG. 4C and are organized into columns A, B, and C, and rows 1 through 6, and together illustrate comparative behavior for large sculpted corrections.

Column A illustrates what might occur where the output object shape is to track a pose of an editor-positioned, e.g., deformation handle 420 relative to key pose 404/408. As explained herein, the key pose for the undeformed object—pose 404—is a straight line on the page, but objects are typically more complicated. A default deformation from key pose 402 or pose 406 is shown as object shape 422. Note that the same points are deformed throughout sequences of moving deformation handle 420 since the key poses do not change. Note also the smooth wire deformation fall-off around deformation handles. The corresponding deformed poses 406 and 408 can be bell-shaped sculpt object pairs. As shown in row 2, the default deformer interpolates the sculpt on the right by happenstance, but does not interpolate the sculpt pose on the left in row 4. Column B shows PSD interpolation where displacement is computed once for each sculpted pose, for example (in row 4, column A) between the sculpted object shape 422 and the default deformed object of object shape 424. This can allow to the sculpted pose to be interpolated using PSD displacements, as in column B, row 4. Column C shows PSD interpolation where the displacement is computed dynamically as the deviation between the current default deformed object at the current pose and each sculpted pose. The extrapolated behavior however (e.g., in column B, row 5, or column C, row 5) might be undesirable as the displacement causes the pose deformation to stay stuck (or worse, partially stuck) to the sculpted pose. Alternately, the extrapolation as in column B, row 1 or column C, row 1 can return to the default deformation behavior but would ignore the sculpt pose. Even interpolated deformations can look unnatural because, while blended deformations might look reasonable for small interpolated displacements, undesirable artifacts can be visually magnified for large displacements. For example, in column B, row 3 or column C, row 3, one might expect bump on the right to simply slide over to the bump on the left, instead of the blended results where one bump descends and the other ascends causing yet a third bump in between. The interpolated behavior of row 6 (column B or C) might also be unexpected.

Figure 4B:
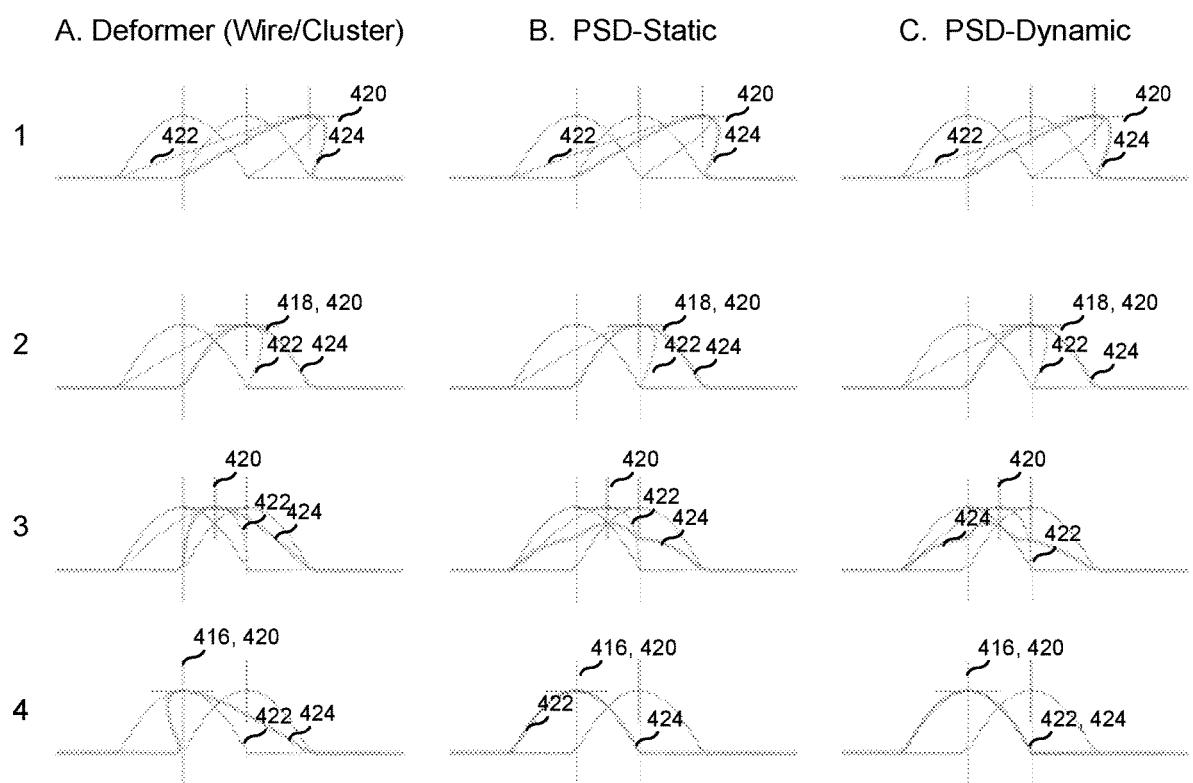
Figure 4C:
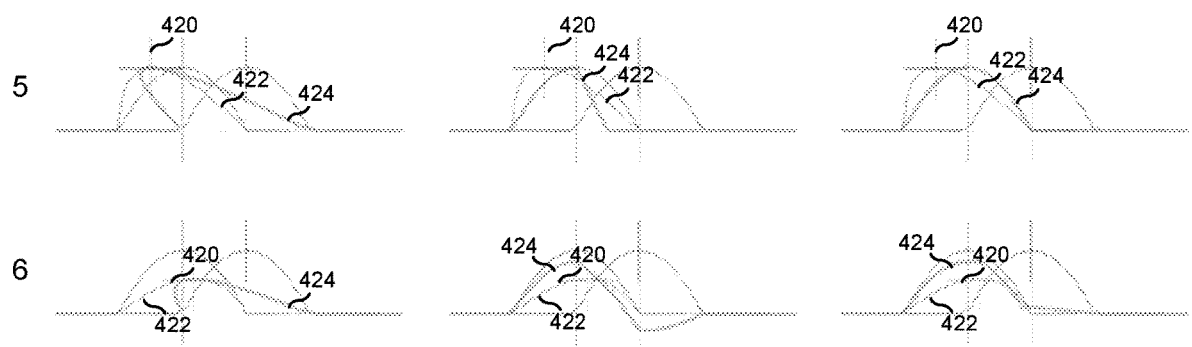
Figure 5A:
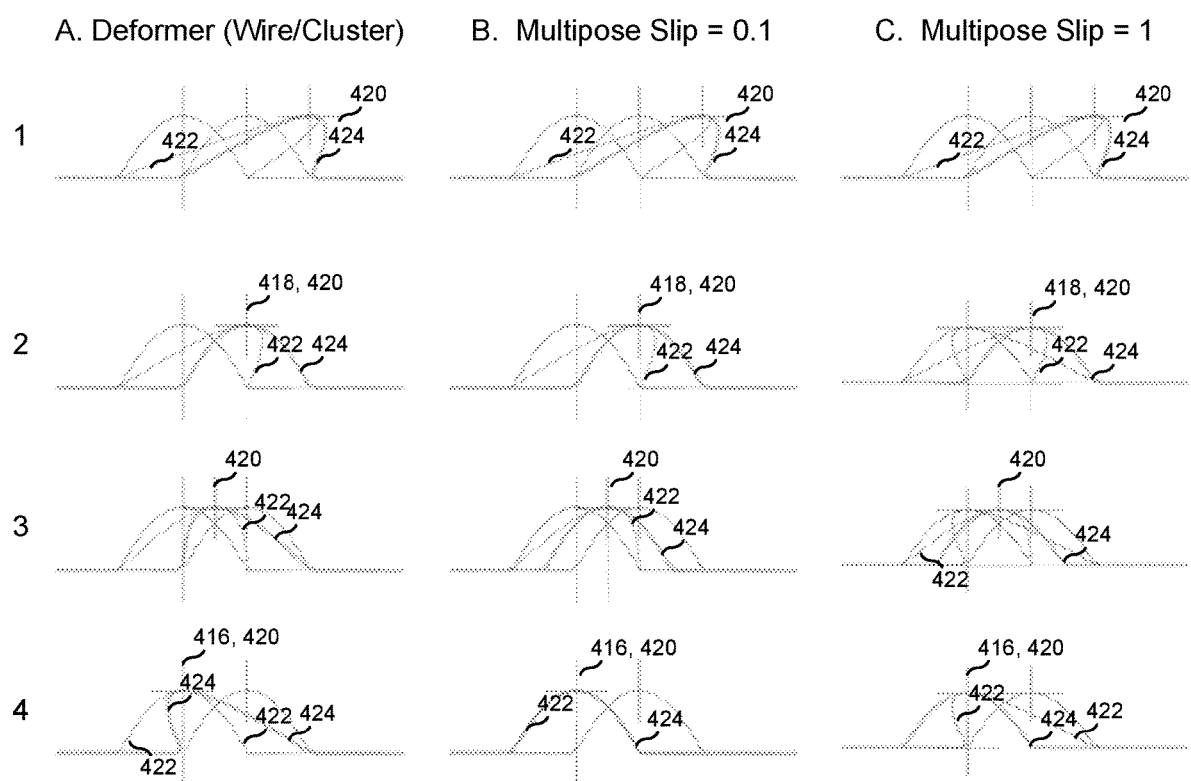
FIG. 5 illustrates comparative behavior for large sculpted corrections, for shapes similar to those shown in FIG. 4.
Figure 5B:
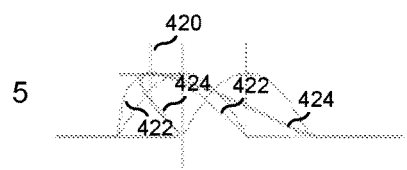
Figure 5B:
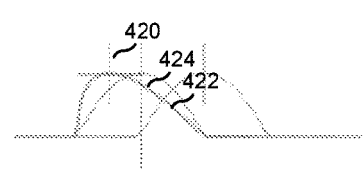
Figure 5B:
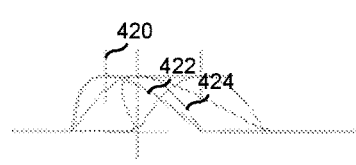
Figure 5B:
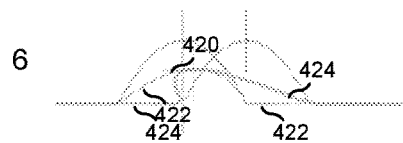
Figure 5B:
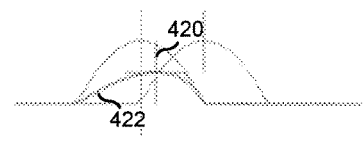
Figure 5B:
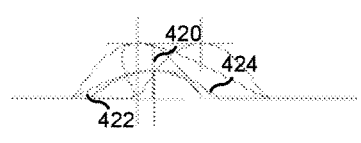

FIG. 5 (comprising FIG. 5A and FIG. 5B) illustrates comparative behavior for large sculpted corrections, for shapes similar to those shown in FIG. 4. Column A shows the same poses as Column A in FIG. 4B and FIG. 4C, where the curve is deformed to track the pose of the editor-moved deformation handle. As shown in row 2, the default deformer interpolates the sculpt on the right by happenstance, but does not interpolate the sculpt pose in column A in row 4. Columns B and C, in contrast to FIG. 4, here show a multi-pose interpolation where handles along the straight line further show key poses and the undeformed object corresponding to the two sculpted poses. Two settings of a multi-pose wire are shown with a slip parameter set to 0.1 (column B) and 1.0 (column C) for the same poses as in FIG. 4, in rows 1 through 6. The behavior for these poses in columns B and C are identical. Note that the two sculpted poses in row 2 and row 4 are precisely interpolated. Note the extrapolation (columns B and C, rows 1 and 5) behave as expected and interpolation behavior of columns B and C, rows 3 and 6 better captures the deformation since the object bind weight functions are interpolated, providing a better object-pose association when the sculpted poses have large displacements from the default deformation.

Elements in FIGS. 4B, 4C, 5A, and 5B are shown with callouts corresponding to elements shown in FIG. 4A and described herein.

Figure 6:
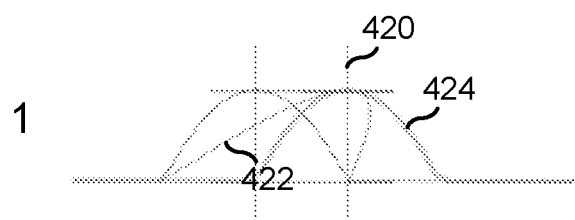
FIG. 6 illustrates multi-pose wire deformation and slip parameter in-between poses.
Figure 6:
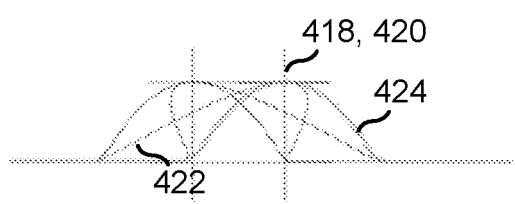
Figure 6:
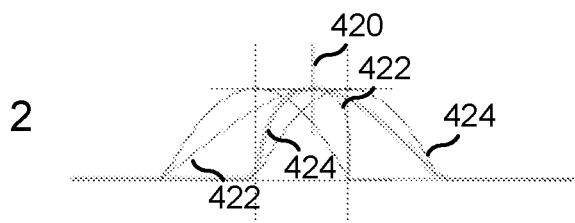
Figure 6:
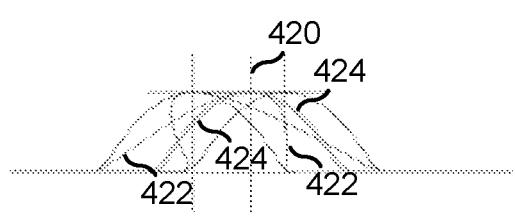
Figure 6:
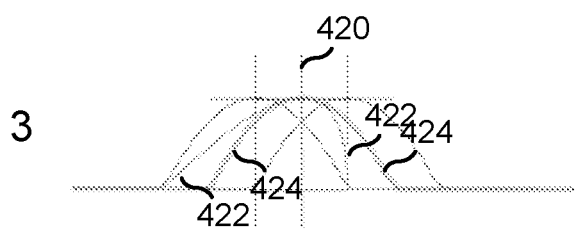
Figure 6:
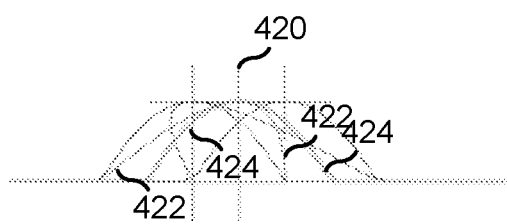
Figure 6:
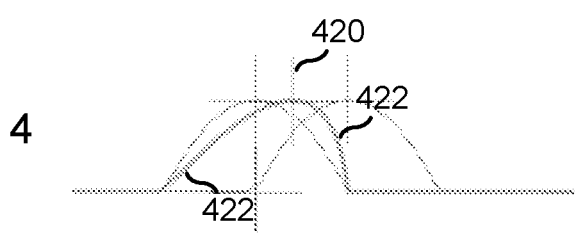
Figure 6:
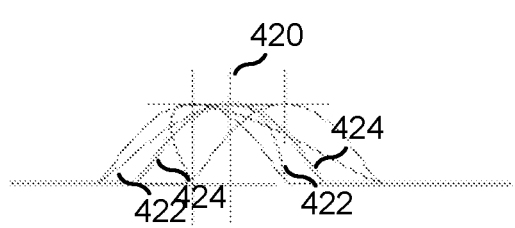
Figure 6:
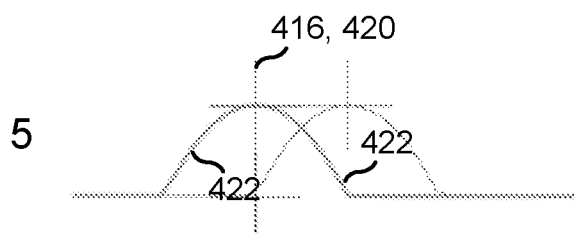
Figure 6:
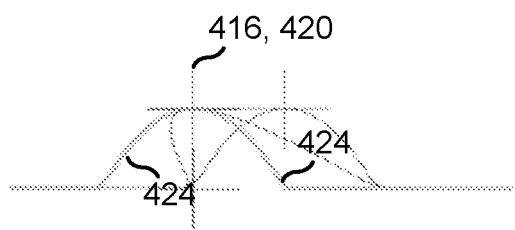

FIG. 6 illustrates multi-pose wire deformation and the slip parameter in-between poses from row 2 to row 4 of FIG. 5. With a slip value set to slip=1, the object processor interpolates the key pose and geometry using the same function weighting as the pose interpolation, resulting in a deformation that travels like a wave from the sculpted pose on the right to the sculpted pose on the left. With a slip value set to slip=0.1, the object processor interpolates a key pose much closer to a Voronoi boundary between the two deformation poses. As a result, the deformation in column A, row 2 is still largely anchored to the key pose on the right and the deformation in row 4 is anchored primarily to the key pose on the left.

Using these techniques, object editors can often sculpt geometry of an object manually to its desired form in a problematic pose. As explained herein, a multi-pose formulation provides for pose sculpts that can be incorporated using an independent combination of interpolation at the bind, and deformation stages, along with an interpolated displacement. Differentially interpolated bind and deformation stages can be used to model slippage. Voronoi-based interpolation might be used for determining how much of each key pose to combine.

Figure 7:
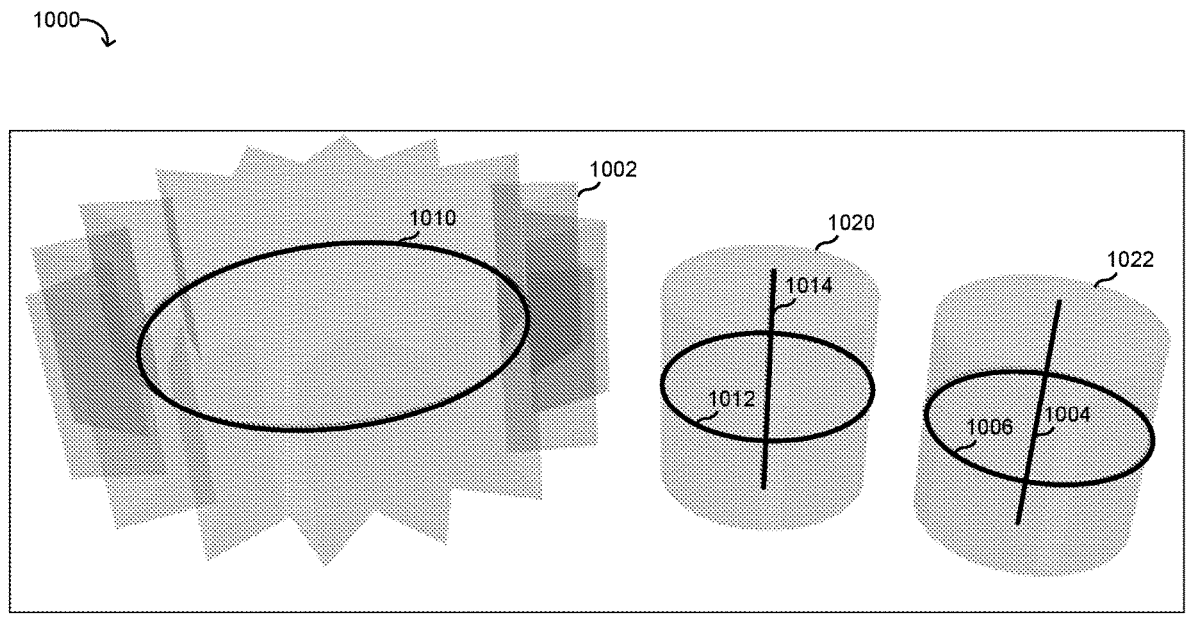
FIG. 7 illustrates an example of a multi-pose deformer.

FIG. 7 illustrates an example of a multi-pose deformer as might be displayed in a user interface 700. As shown there, an object 702 is deformed using two curves 704 and 706 of an object 722. The key poses, represented by two sculpt object curve poses 710 and 712, can be used to deform an object 802 depicted in FIG. 8. Note only a single curve-object pair need be used for a straight axial curve 714. A multi-pose deformation enables the tooth-like detail of object 702 to be integrated into the object deformation rather than as an interpolated displacement added after deformation.

Figure 8:
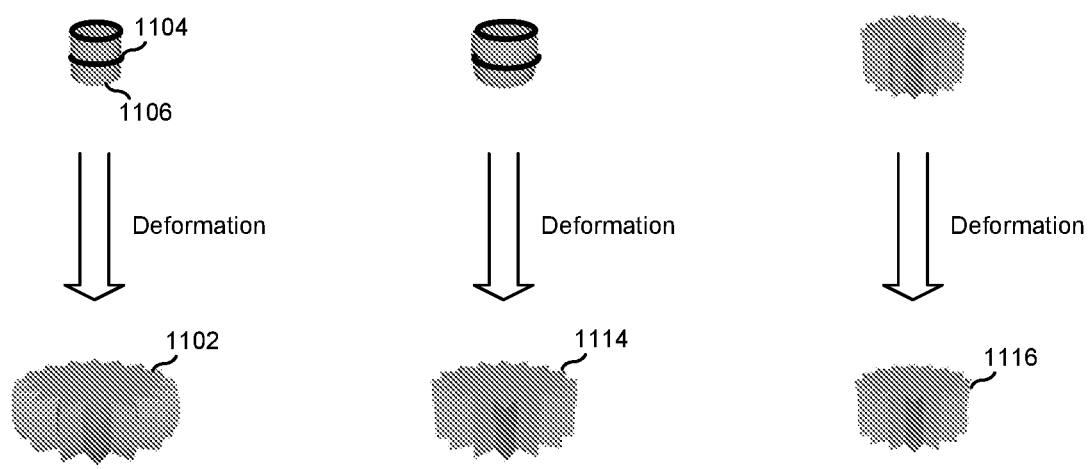
FIG. 8 illustrates a multi-pose deformer example of FIG. 7.

FIG. 8 illustrates a multi-pose deformer example of FIG. 7. A circle 804 as in FIG. 7 is scaled clockwise from object 806, from a cylindrical pose 720 shown in FIG. 7 to a gear-shaped pose of object 702. These poses are interpolated as object 806 and object 814 as in FIG. 8, and further extrapolated into object 816.

Detailed Programming Example

The following sections describe programming code that an object processor might use to generate object shapes and the like. For ease of exposition, some of the steps are described as mathematical operations, which should be understood to be implemented electronically.

Corrective Displacements

Corrective displacements as designed by PSD [L+00], work best at small amplitude over a localized region of pose space. Large corrective deformations defined for a sparse set of deformation handle(s) distant in pose space, are better handled by incorporating them into the handle-based deformation itself, hence the term multi-pose deformation. As a point of contrast, PSD deforms a point p to p'=deform(p, l)+δ, where deform is a function that a graphics system might use to convert values from p to p' to deform p by the given pose l and δ, where δ is a user specified corrective displacement. For cluster or linear blend skinning (LBS) based deformations, a processor might us deform(p, l)= $\Sigma_{[k=1 \, to \, n]} W_k L_k B_k^{-1} p$. As used herein, p is an undeformed point on the object M, $L_1, \ldots, L_n$ are the deformed world space joint transforms (deformation handles) that comprise the pose l, the values $B_1, \ldots, B_n$ represent a configuration of corresponding joint transforms at which points on the object are associated or bound to the joints, based on which the weights $W_1, \ldots, W_n$ are computed. The quantity $L_k B_k^{-1} p$ in the deform( ) function thus first transforms the point p via $B_k^{-1}$ to the local space of the k-th joint, in its bound configuration, and then back to world space via the transform $L_k$, based on the current configuration of the k-th joint. The expression $L_k B_k^{-1} p$ thus associates (and logically rigidly attaches) p to the relative transformation of the k-th joint from $B_k$ to $L_k$. The weights $W_1, \ldots, W_n$ are non-negative, typically spatially smooth functions on the object that sum to 1, that blend these rigid deformations smoothly. The values for $L_i$ and $B_i$ might be represented in computer memory as values for a 4×4 matrix used for transformation.

The graphics system that a user can use for posing and the like might maintain a data structure referred to as a pose set, which is a collection of one or more poses of an object. For example, a pose set $Q$ of an object M might contain one or more key poses q for which object M has been further sculpted by a user to a point $p^q$ on the object $M^q$. For this, the corrective displacement, $d^q$, for a pose q might be set according to $d^q = p^q - \text{deform}(p, q)$. PSD techniques might be used to interpolate this displacement between such poses q. such interpolation can be represented as in Equation 1.

$$p' = \Sigma_{k=1}^{n}(W_k L_k B_k^{-1} p) + \text{disp-interpolate}_{q \in Q}$$
$$(d^q, L_1^q, \ldots, L_n^q, L_1, \ldots, L_n) \quad \text{(Eqn. 1)}$$

The function disp-interpolate( ) returns a pose-interpolated corrective displacement vector. The interpolation is such that at a pose q, defined by its configuration of transforms $L_1^q, \ldots, L_n^q$, the interpolating function precisely returns $d^q$. There are a number of interpolating functions with various properties that can be used to spread and blend the contribution of displacement $d^q$ from the poses $q \in Q$ for which they are defined [L+00]. The PSD formulation for the entire object M could thus be written as in Equation 2, where the bind and deform joint transforms $B_k, L_k, L_k^q$ respectively are collectively referred to as poses b, l, and q, and $D^q$ collates the displacements $d^q$ for all points on the object.

$$M' = \text{PSDdeform}(M^b, b, l) + \textit{disp-interpolate}_{q \in Q} (D^q, q, l) \quad \text{(Eqn. 2)}$$

Fundamentally though, such a combination of displacement vectors provides the best results when their deformation amplitude is small relative to that induced by the deformation handles. In general, the object processor can represent an interpolation that is based on pose l of some data attribute A, defined herein as $A^q$ at some pose set $Q$ of poses q, using the function $\textit{data-interpolate}_{q \in Q}(A^q, q, l)$, where the function data-interpolate( ) returns a value of attribute A that is an interpolant of the values $A^q$ at poses q, based on the affinity between pose l, and the poses in pose set $Q$.

Multi-Pose Formulation

A multi-pose deformer can incorporate a pose interpolation into a handle deformation itself, using a process having three stages: bind, deform and displace.

The first is a bind stage where various deformation parameters are computed to associate points on the object to the configuration of deformation handle(s) that comprise a pose. One example of this would be the skinning weights computed for a point on the object that bind them to joint transforms in the cluster/skinning example described above. Another example of bind deformation parameters in the context of a wire deformation [SF98], would be a set of normalized weights that define the relative proximity of points to a set of curves, weights that define the independent proximity of curves, and parameter value of a proximal point on the curves with which to associate the deformation.

The next stage is a deformation for a given pose, that deforms a point on the object to account for a relative change in the deformation handle(s) from a key pose to the given pose. In the context of a wire deformation, for example, a point can be displaced based on the relative displacement between the reference and wire curve of a proximal point on a wire curve.

Finally, residual differences between a point on the deformed object and its desired position (whether artist sculpted, physically simulated, or driven by data capture) can be defined as a pose-interpolated displacement.

Bind:

Formally for a point $p^b$ of an object being associated with a key pose b, a weight, $W_b$, is $W_b = \text{bind}(p^b, b)$, where a set of weights and other parameters $W_b$ associate the deformation handle(s) configuration comprising pose b, with the point $p^b$ on object $M^b$. When referring to the entire set of points comprising the object M, this might be expressed as $W_b = \text{bind}(M^b, b)$.

Deform:

Points $p^b$ are then deformed relative to its reference pose r (typically the same as b) based on the bind parameters and the handle(s) corresponding to the current pose l as in Equation 3. For example, in the context of a wire deformation if $w^b$ comprises a deformation weight $W^b$, and a closest point on a curve corresponding to curve parameter $pr^b$, the deformation can be written as in Equation 3.

$$p'=\text{deform}(p^b,b,W^b,r,l)=p^b+W^{b*}(l(pr^b)-r(pr^b)) \quad \text{(Eqn. 3)}$$

In Equation 3, l( ) and r( ) represent parametric curves and $l(pr^b)$ and $r(pr^b)$ are points on the respective parametric curves.

Displace:

The PSD formulation would be written as in Equation 4.

$$p'=\text{deform}(p^b,b,W^b,r,l)+\text{disp-interpolate}_{p\in Q}(d^q q,l) \quad \text{(Eqn. 4)}$$

The entire object's formulation can be written as in Equation 5.

$$M'=\text{deform}(M^b,b,W^b,r,l)+\text{disp-interpolate}_{q\in Q}(D^q,q,l) \quad \text{(Eqn. 5)}$$

Interpolation:

An object processor can operate to interpolate one or both of the bind( ) and deform( ) functions in a general multi-pose scenario so that the sculpted poses are integrated into the deformation enabling better extrapolation from the poses, better response to deformation parameters and to reduce need for PSD displacement interpolation. An operation of a general multi-pose deformation can be written as in Equation 6 and Equation 7 for binding at poses in a pose set $\mathcal{B}$ of poses ($b \in \mathcal{B}$), deforming poses in a pose set $\mathcal{F}$ of poses ($f \in \mathcal{F}$), and PSD interpolating poses $q \in \mathcal{Q}$ (which, in one embodiment, might have $\mathcal{B} \subseteq \mathcal{F} \subseteq \mathcal{Q}$ for a given pose l.

$$W^l = \textbf{\textit{bind-interpolate}}_{b \in \mathcal{B}} (M^b,b,l) = \textbf{\textit{bind-interpolate}}_{b \in \mathcal{B}} (M^b,b,l),l) \quad \text{(Eqn. 6)}$$

$$W^l = \textbf{\textit{bind-interpolate}}_{b \in \mathcal{B}} (M^b,b,l) = \textbf{\textit{data-interpolate}}(\textbf{\textit{bind}}_{b \in \mathcal{B}} (M^b,b)b,l) \quad \text{(Eqn. 7)}$$

In Equation 6, the pose l is determined as a weighted interpolation of the poses $b \in \mathcal{B}$, and these weights are used to data-interpolate the object geometry $M^b$, which is then bound to the pose l, to produce deformation parameters/weights $W^l$. Alternately, the pose l might be determined as a weighted interpolation of the poses $b \in \mathcal{B}$, and these weights used to subsequently data-interpolate the deformation parameters $W^b$.

Similarly, the deform( ) functions may be interpolated for $f \in \mathcal{F}$, as in Equation 8.

$$M^l = \textbf{\textit{deform-interpolate}}_{f \in \mathcal{F}} (M^f,b,W^b,r^f,l) \quad \text{(Eqn. 8)}$$

With a single key pose b, the pose l can be determined as a weighted interpolation of the poses $f \in \mathcal{F}$, and these weights can be used to data-interpolate the object geometry $M^f$ deformed as a result of the relative change between pose $r^f$ and l, whose deformation parameters $W^b$ are estimated using an object-pose pair ($M^b$, b). In one embodiment, the reference pose $r^f$ is simply f. The weights might be a discrete set of weights or a bind weight function. An interpolated deformation can be combined with an interpolated bind as in Equation 9.

$$M^l = \textbf{\textit{deform-interpolate}}_{f \in \mathcal{F}} (M^f, \textbf{\textit{bind-interpolate}}_{b \in \mathcal{B}} (M^b,b,l),r^f,l) \quad \text{(Eqn. 9)}$$

In yet another implementation, the interpolated deformation can be further combined with a PSD-like displacement interpolation as in Equation 10.

$$M'=\textbf{\textit{deform-interpolate}}_{f \in \mathcal{F}} (M^f,f, \textbf{\textit{bind-interpolate}}_{b \in \mathcal{B}} (M^b,b,l),r^f,l)+\text{disp-interpolate}_{q \in \mathcal{Q}} (D^b,q,l) \quad \text{(Eqn. 10)}$$

User Workflow

Sculpted poses are either authored by users to better specify deformation behavior, or can automatically defined in a data-driven setting (for example where the deformed object is reconstructed from performance capture data). In either case, as formulated above the sculpted poses may be used beyond a simple PSD displacement, to interpolate the bind and/or the deformation behavior as formulated above.

In a typical workflow, a user may begin with a pose, b, comprising deformation handle(s) and a static object $M^b$. Bind parameters can be computed using this configuration as $W^b$=bind($M^b$, b). This can be akin to traditional spatial deformation. In the presence of a set of data-driven pose-object pairs q, $M^q$, for a pose set $\mathcal{Q}$ of poses $q \in \mathcal{Q}$, an object processor can compute a set $\mathcal{Q}^b$ of configurations for which the difference between the deformed points and those specified by the pose is small A predetermined value might be stored as a threshold value, Thr, and a test performed to determine whether the inequality of Equation 11 is true or false.

$$\text{def-pose-diff}(M,q,b,l,W)=\|M^q-\text{deform}(M^b,b,W^b,b,l)\| < \text{Thr} \quad \text{(Eqn. 11)}$$

Such sculpted pose configurations can be well represented by PSD interpolated displacements. However, if poses with a larger difference exist, they can be handled using multi-pose interpolated using the bind( ) and/or deform( ) functions. For example, a process may automatically pick some configuration poses $q' \in (\mathcal{Q}, -\mathcal{Q}^b)$ with the value of the function def-pose-diff(M, q', b, l, W) that yields the largest difference or might pick another configuration, possibly subject to the constraint that the difference is greater than some predetermined Thr value. This can be added to the multi-pose deformation set $\mathcal{F}$ and/or the multi-pose bind set $\mathcal{B}$. Alternately, the user may pick such a pose q' interactively. In the absence of data-driven pose-object pairs, a user might simply pick a pose l' where the deformed object deform($M^b$, b, $W^b$, b, l') appearance is unsatisfactory, sculpt it to $M^{l'}$, and similarly add that pose-object pair (l', $M^{l'}$) to the multi-pose bind and/or deform sets.

This process can be used to iteratively build up the multi-pose bind( ) and deform( ) sets and be used as part of a multi-pose deformer that integrates seamlessly into a typical modeling and animation pipeline as a module that deforms input geometry based on interpolation of multiple pose-object pairs.

Deformed Contributions

The deformed contribution of each curve can then be combined in a number of ways in the original formulation ranging from a simple cumulative deformation to one that is weighted by the magnitude of deformation.

Voronoi-Based Multi-Pose Interpolation

As previously described, one needs to be able to infer interpolation weights for a given pose l, corresponding to a given set of poses $\{q_1, \ldots, q_n\}$. There are many ways this can be done. One implementation is based on the Voronoi-space of the pose vectors (a set of joints angles for a skeleton, or a set of curve points for wire curves). Many of the properties desirable for the interpolant are described in [L+00] and [B+13]. For interpolation, a weight vector $(W_1, \ldots, W_m)$ might be normalized (i.e., the weights sum up to 1) and the weights might all be non-negative. Further, the pose set could be precisely interpolated, i.e., whenever a pose l is equal to pose $q_i$ for some i, then W=1 (and all other weights are zero as a result). A person of ordinary skill in the art will appreciate that there are two aspects to a Voronoi-based computation of such weights. First, a pose-to-pose measure of distance can be defined that captures the proximity/affinity between poses. Second, these distances between a pose l and poses in the multi-pose set $\{q_1, \ldots, q_m\}$ that define Voronoi regions can be transformed into normalized weights $W_1, \ldots, W_m$, that reflect the proximity/affinity between the curves. Examples of both aspects, are provided below:

Pose-to-Pose Distance

A simple distance measure for poses defined as a vector of numeric values, is the $L^2$ norm between two such vectors, i.e., for two pose vectors a and b, the $L^2$ distance, d(a, b), is d(a, b)=sqrt($\Sigma_{[i=1 \text{ to } n]}(a_i-b_i)^2$), where $a_i$ and $b_i$ are the components of an N-dimensional vector. In the context of wire curves, each pose $q_i$ can comprise a set of multiple wire curves as might be expressed as $\{c^1, \ldots, c^k\}$. Each wire curve can then be further represented as a polyline of 3D points, such that curve $c^j = <p^j_1, p^j_1, \ldots, p^j_{nj}>$. The pose vector for $q_i$ can thus be a concatenation of the 3D points for the k curves. Alternately, since the deformation is a weighted sum of the deformation contribution of individual wire curves, fine-grained multi-pose behavior can be computed by defining a subpose-subpose distance for each corresponding wire curve $d_j(q, l) = d(c^j_q, c^j_l)$, where the proximity/affinity of a pose l to a multi-pose q is computed as a sub-pose affinity $d_j$ between the corresponding j-th wire curve of l and q.

A person of ordinary skill in the art would also note, that a variety of other curve to curve distance measures such as the Hausdorff distance or the Frechet distance can capture different aspects of geometric similarity between the curves. For the purpose of this invention the $L^2$ norm as described above either for the entire pose (set of wire curves), or sub-pose (for each corresponding wire curve) provides the desired notion of proximity/affinity when using wire curves for multi-pose deformation.

Normalized weight vector computation: Given a pose to pose (or sub-pose to sub-pose) distance between a pose l and poses in a multi-pose set $\{q_1, \ldots, q_m\}$, a number of functions can provide desired geometric properties of the interpolating weight vector $(W_1, \ldots, W_m)$. A simple example function sometimes called a nearest neighbor interpolant, given l and $\{q_1, \ldots, q_m\}$, returns a weight vector $(W_{11}, \ldots, W_m)$, where $W=1$ for the nearest pose $q_i$, i.e., the pose $q_i$ belonging to the set $\{q_1, \ldots, q_m\}$ for which $d(l, q_i)$ is the smallest. For all other poses where $j \neq i$, $W_j$ is set to zero. The sub-pose version of such a function simply picks the nearest neighbor in the multi-pose set for a specific wire curve. The nearest neighbor interpolant essentially defines the geometric deformation based entirely on the nearest multi-pose. As can be expected with such an interpolant, there will likely be discontinuities in the geometric deformation as the manipulated pose l transitions across Voronoi boundaries from one closest multi-pose to another. An example of a weight function with smoother transitions can be defined as follows. Given a pose l and the pose set $\{q_1, \ldots, q_m\}$, the nearest k neighbors are computed, where the difference in distance from the nearest pose i is less than a factor $\varphi$ (for example, $\varphi=0.5$) of the nearest distance $d(l, q_j)-d(l, q_i) <= \varphi^*d(l, q_i)$. The weight $W_j=f(d(l, q_j)-d(l, q_i)/\varphi^*d(l, q_i))$, where $f(x)$ is a sigmoid function with a value of $f(x)=0$ for $x>1$ and smoothly falls off from $f(x)=1$ at $x=0$ to $f(x)=0$ at $x=1$. An example of such a function in the domain [0,1] includes $f(x)=(x^2-1)^2$. Finally, resulting weight vector is then normalized by dividing each weight by the sum of the weights. Note that the above smooth interpolant degenerates to the nearest neighbor interpolant when $\varphi=0$. A number of other smooth fall-off functions and Voronoi based weight interpolants are also known [L+00] and [B+13].

Detailed Programming Example

General Multi-Pose Attribute Interpolation

Interpolation of attributes in general for deformable objects: As described in this invention the multi-pose deformation framework is designed to control the shape (position of points) of an object based on its spatial relationship and manipulation of deformation proxy geometry like wire curves. Equation 12 is a representation of the general deformation formulation.

$$M' = \textbf{\textit{deform-interpolate}}_{f \in \mathcal{F}} (M^f, f, \\
\textbf{\textit{bind-interpolate}}_{b \in \mathcal{B}} (M^b, b, l), r^f, l) + \\
\textbf{\textit{disp-interpolate}}_{q \in \mathcal{Q}} (l, q, D^q) \quad \text{(Eqn. 12)}$$

The stages bind( ), deform( ), and disp( ) in Equation 12 can be a functional interpolation of a deformation mapping of point position on an object. The interpolation can be based on interpolation weights calculated using the relationship between the object and the geometry of the deformation proxy.

A person of ordinary skill in the art will appreciate that these interpolation weight values can be used to meaningfully interpolate general numeric attributes defined at points on the object as example herein illustrate. For example, two key poses can be defined for a relaxed/neutral and angry face geometry, for example associated with multi-pose wire curves that define a relaxed and deeply furrowed brow shape respectively. This example under the simplified formulation might be where only the deform function is interpolated, i.e., wherein the value of M' is set to $\textbf{\textit{deform-interpolate}}_{f \in \mathcal{F}}$ M', b, $W^b$, $r^f$, l). Here, the set of multi-pose curves, $\mathcal{F}$, is of size 2, i.e., a brow curve $r^1$ and $r^2$ for a relaxed/neutral $M^1$ face geometry and an angry $M^2$ face geometry respectively. The geometry could be bound to the relaxed brow, i.e., $b=r^1$, and bind parameters $W^b$ computed by binding $r^1$ to $M^1$.

Now using these bind parameters, given an animated brow curve l, the 3D positions of points on the face are deformed both from $M^1$ and $M^2$ to manifest the relative change between pose $r^1$ and l, and between pose $r^2$ and l, respectively. The final deformed positions of points are a multi-pose interpolation of between the deformed results due to the two reference poses. The interpolation weights are defined based on the proximity/affinity between the curve l, and the multi-pose reference curves $r^1$ and $r^2$ respectively (the greater the proximity the greater the weight).

Now, in addition to the deformable geometry for different facial expressions/poses, the multi-pose framework can have different values for other attributes such as UV coordinates that define a texture parameterization, or texture map images representing the skin tone, wrinkling and blood flow in the face. For instance, the UV parameters may be displaced from a neutral to angry expression, to simulate the travel of a fine wrinkle along the skin in a wrinkle texture image. Similarly, a different blood flow texture image might be used to convey increased blood flow in an angry face. Now the brow curve l on animation as described may deform the skin geometry based on interpolation weights for $r^1$ and $r^2$ as aforementioned, but may also (or alternatively) be used to interpolate the UV-texture coordinates, or pixel color of the blood flow texture images, defined for the neutral and angry face.

In general, the interpolation weights computed for pose l relative to the multi-poses in the pose set $\mathcal{F}$ ($f \in \mathcal{F}$) may be used to data-interpolate a generic numeric attribute associated with each of the poses $f \in \mathcal{F}$.

Hardware Example

Figure 9:
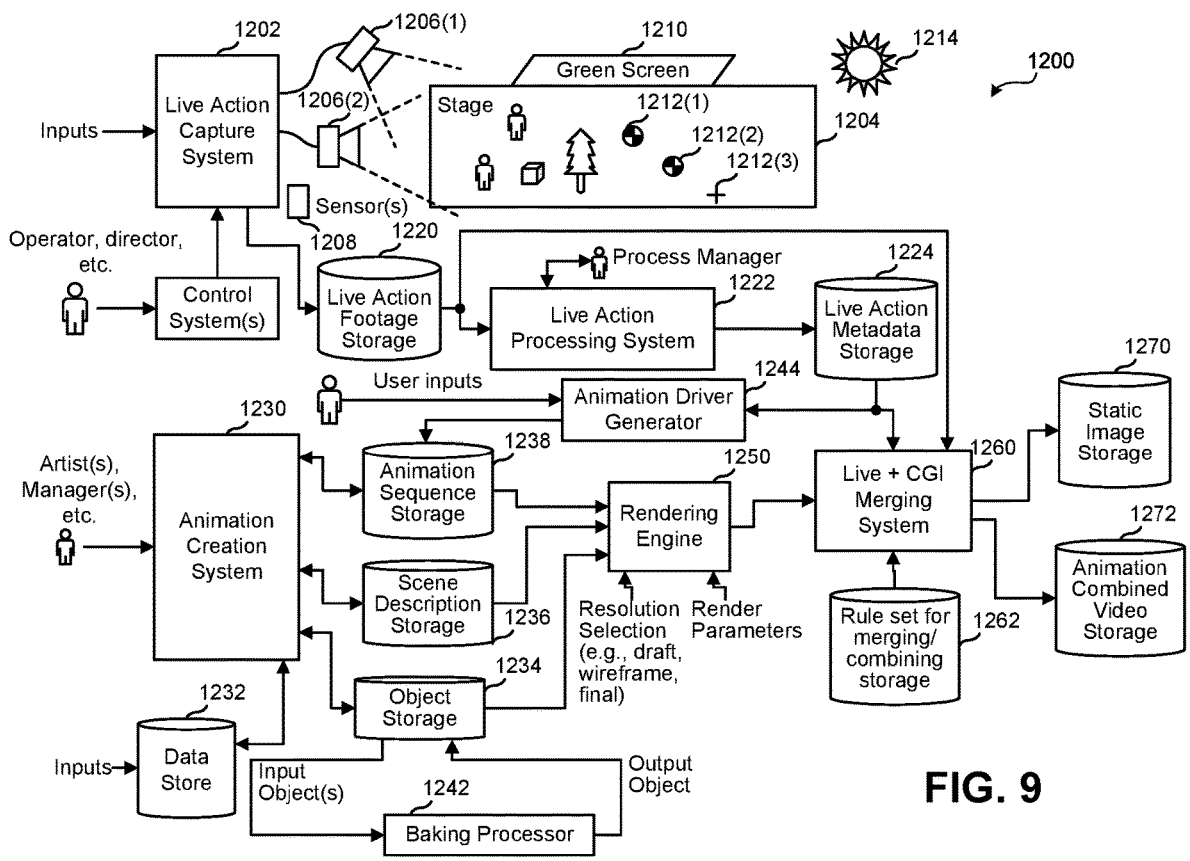
FIG. 9 illustrates an example visual content generation system as might be used to generate imagery in the form of still images and/or video sequences of images, according to various implementations.

FIG. 9 illustrates an example visual content generation system 900 as might be used to generate imagery in the form of still images and/or video sequences of images. Visual content generation system 900 might generate imagery of live action scenes, computer generated scenes, or a combination thereof. In a practical system, users are provided with tools that allow them to specify, at high levels and low levels where necessary, what is to go into that imagery. For example, a user might be an animation artist (like editor 102 illustrated in FIG. 1) and might use visual content generation system 900 to capture interaction between two human actors performing live on a sound stage and replace one of the human actors with a computer-generated anthropomorphic non-human being that behaves in ways that mimic the replaced human actor's movements and mannerisms, and then add in a third computer-generated character and background scene elements that are computer-generated, all in order to tell a desired story or generate desired imagery.

Still images that are output by visual content generation system 900 might be represented in computer memory as pixel arrays, such as a two-dimensional array of pixel color values, each associated with a pixel having a position in a two-dimensional image array. Pixel color values might be represented by three or more (or fewer) color values per pixel, such as a red value, a green value, and a blue value (e.g., in RGB format). Dimensions of such a two-dimensional array of pixel color values might correspond to a preferred and/or standard display scheme, such as 1920-pixel columns by 1280-pixel rows or 4096-pixel columns by 2160-pixel rows, or some other resolution Images might or might not be stored in a certain structured format, but either way, a desired image may be represented as a two-dimensional array of pixel color values. In another variation, images are represented by a pair of stereo images for three-dimensional presentations and in other variations, an image output, or a portion thereof, might represent three-dimensional imagery instead of just two-dimensional views. In yet other implementations, pixel values are data structures and a pixel value can be associated with a pixel and can be a scalar value, a vector, or another data structure associated with a corresponding pixel. That pixel value might include color values, or not, and might include depth values, alpha values, weight values, object identifiers or other pixel value components.

A stored video sequence might include a plurality of images such as the still images described above, but where each image of the plurality of images has a place in a timing sequence and the stored video sequence is arranged so that when each image is displayed in order, at a time indicated by the timing sequence, the display presents what appears to be moving and/or changing imagery. In one representation, each image of the plurality of images is a video frame having a specified frame number that corresponds to an amount of time that would elapse from when a video sequence begins playing until that specified frame is displayed. A frame rate might be used to describe how many frames of the stored video sequence are displayed per unit time. Example video sequences might include 24 frames per second (24 FPS), 50 FPS, 140 FPS, or other frame rates. In some implementations, frames are interlaced or otherwise presented for display, but for clarity of description, in some examples, it is assumed that a video frame has one specified display time, but other variations might be contemplated.

One method of creating a video sequence is to simply use a video camera to record a live action scene, i.e., events that physically occur and can be recorded by a video camera. The events being recorded can be events to be interpreted as viewed (such as seeing two human actors talk to each other) and/or can include events to be interpreted differently due to clever camera operations (such as moving actors about a stage to make one appear larger than the other despite the actors actually being of similar build, or using miniature objects with other miniature objects so as to be interpreted as a scene containing life-sized objects).

Creating video sequences for story-telling or other purposes often calls for scenes that cannot be created with live actors, such as a talking tree, an anthropomorphic object, space battles, and the like. Such video sequences might be generated computationally rather than capturing light from live scenes. In some instances, an entirety of a video sequence might be generated computationally, as in the case of a computer-animated feature film. In some video sequences, it is desirable to have some computer-generated imagery and some live action, perhaps with some careful merging of the two.

While computer-generated imagery might be creatable by manually specifying each color value for each pixel in each frame, this is likely too tedious to be practical. As a result, a creator uses various tools to specify the imagery at a higher level. As an example, an artist (e.g., editor 102 illustrated in FIG. 1) might specify the positions in a scene space, such as a three-dimensional coordinate system, of objects and/or lighting, as well as a camera viewpoint, and a camera view plane. From that, a rendering engine could take all of those as inputs, and compute each of the pixel color values in each of the frames. In another example, an artist specifies position and movement of an articulated object having some specified texture rather than specifying the color of each pixel representing that articulated object in each frame.

In a specific example, a rendering engine performs ray tracing wherein a pixel color value is determined by computing which objects lie along a ray traced in the scene space from the camera viewpoint through a point or portion of the camera view plane that corresponds to that pixel. For example, a camera view plane might be represented as a rectangle having a position in the scene space that is divided into a grid corresponding to the pixels of the ultimate image to be generated, and if a ray defined by the camera viewpoint in the scene space and a given pixel in that grid first intersects a solid, opaque, blue object, that given pixel is assigned the color blue. Of course, for modern computer-generated imagery, determining pixel colors—and thereby generating imagery—can be more complicated, as there are lighting issues, reflections, interpolations, and other considerations.

As illustrated in FIG. 9, a live action capture system 902 captures a live scene that plays out on a stage 904. Live action capture system 902 is described herein in greater detail, but might include computer processing capabilities, image processing capabilities, one or more processors, program code storage for storing program instructions executable by the one or more processors, as well as user input devices and user output devices, not all of which are shown.

In a specific live action capture system, cameras 906(1) and 906(2) capture the scene, while in some systems, there might be other sensor(s) 908 that capture information from the live scene (e.g., infrared cameras, infrared sensors, motion capture ("mo-cap") detectors, etc.). On stage 904, there might be human actors, animal actors, inanimate objects, background objects, and possibly an object such as a green screen 910 that is designed to be captured in a live scene recording in such a way that it is easily overlaid with computer-generated imagery. Stage 904 might also contain objects that serve as fiducials, such as fiducials 912(1)-(3), that might be used post-capture to determine where an object was during capture. A live action scene might be illuminated by one or more lights, such as an overhead light 914.

During or following the capture of a live action scene, live action capture system 902 might output live action footage to a live action footage storage 920. A live action processing system 922 might process live action footage to generate data about that live action footage and store that data into a live action metadata storage 924. Live action processing system 922 might include computer processing capabilities, image processing capabilities, one or more processors, program code storage for storing program instructions executable by the one or more processors, as well as user input devices and user output devices, not all of which are shown. Live action processing system 922 might process live action footage to determine boundaries of objects in a frame or multiple frames, determine locations of objects in a live action scene, where a camera was relative to some action, distances between moving objects and fiducials, etc. Where elements have sensors attached to them or are detected, the metadata might include location, color, and intensity of overhead light 914, as that might be useful in post-processing to match computer-generated lighting on objects that are computer-generated and overlaid on the live action footage. Live action processing system 922 might operate autonomously, perhaps based on predetermined program instructions, to generate and output the live action metadata upon receiving and inputting the live action footage. The live action footage can be camera-captured data as well as data from other sensors.

An animation creation system 930 is another part of visual content generation system 900. Animation creation system 930 might include computer processing capabilities, image processing capabilities, one or more processors, program code storage for storing program instructions executable by the one or more processors, as well as user input devices and user output devices, not all of which are shown. Animation creation system 930 might be used by animation artists, managers, and others to specify details, perhaps programmatically and/or interactively, of imagery to be generated. From user input and data from a database or other data source, indicated as a data store 932, animation creation system 930 might generate and output data representing objects (e.g., a horse, a human, a ball, a teapot, a cloud, a light source, a texture, etc.) to an object storage 934, generate and output data representing a scene into a scene description storage 936, and/or generate and output data representing animation sequences to an animation sequence storage 938.

Scene data might indicate locations of objects and other visual elements, values of their parameters, lighting, camera location, camera view plane, and other details that a rendering engine 950 might use to render CGI imagery. For example, scene data might include the locations of several articulated characters, background objects, lighting, etc. specified in a two-dimensional space, three-dimensional space, or other dimensional space (such as a 2.5-dimensional space, three-quarter dimensions, pseudo-3D spaces, etc.) along with locations of a camera viewpoint and view place from which to render imagery. For example, scene data might indicate that there is to be a red, fuzzy, talking dog in the right half of a video and a stationary tree in the left half of the video, all illuminated by a bright point light source that is above and behind the camera viewpoint. In some cases, the camera viewpoint is not explicit, but can be determined from a viewing frustum. In the case of imagery that is to be rendered to a rectangular view, the frustum would be a truncated pyramid. Other shapes for a rendered view are possible and the camera view plane could be different for different shapes.

Animation creation system 930 might be interactive, allowing a user to read in animation sequences, scene descriptions, object details, etc. and edit those, possibly returning them to storage to update or replace existing data. As an example, an operator might read in objects from object storage into a baking processor 942 that would transform those objects into simpler forms and return those to object storage 934 as new or different objects. For example, an operator might read in an object that has dozens of specified parameters (movable joints, color options, textures, etc.), select some values for those parameters and then save a baked object that is a simplified object with now fixed values for those parameters.

Rather than requiring user specification of each detail of a scene, data from data store 932 might be used to drive object presentation. For example, if an artist is creating an animation of a spaceship passing over the surface of the Earth, instead of manually drawing or specifying a coastline, the artist might specify that animation creation system 930 is to read data from data store 932 in a file containing coordinates of Earth coastlines and generate background elements of a scene using that coastline data.

Animation sequence data might be in the form of time series of data for control points of an object that has attributes that are controllable. For example, an object might be a humanoid character with limbs and joints that are movable in manners similar to typical human movements. An artist can specify an animation sequence at a high level, such as "the left hand moves from location (X1, Y1, Z1) to (X2, Y2, Z2) over time T1 to T2", at a lower level (e.g., "move the elbow joint 2.5 degrees per frame") or even at a very high level (e.g., "character A should move, consistent with the laws of physics that are given for this scene, from point P1 to point P2 along a specified path").

Animation sequences in an animated scene might be specified by what happens in a live action scene. An animation driver generator 944 might read in live action metadata, such as data representing movements and positions of body parts of a live actor during a live action scene Animation driver generator 944 might generate corresponding animation parameters to be stored in animation sequence storage 938 for use in animating a CGI object. This can be useful where a live action scene of a human actor is captured while wearing mo-cap fiducials (e.g., high-contrast markers outside actor clothing, high-visibility paint on actor skin, face, etc.) and the movement of those fiducials is determined by live action processing system 922. Animation driver generator 944 might convert that movement data into specifications of how joints of an articulated CGI character are to move over time.

A rendering engine 950 can read in animation sequences, scene descriptions, and object details, as well as rendering engine control inputs, such as a resolution selection and a set of rendering parameters. Resolution selection might be useful for an operator to control a trade-off between speed of rendering and clarity of detail, as speed might be more important than clarity for a movie maker to test some interaction or direction, while clarity might be more important than speed for a movie maker to generate data that will be used for final prints of feature films to be distributed. Rendering engine 950 might include computer processing capabilities, image processing capabilities, one or more processors, program code storage for storing program instructions executable by the one or more processors, as well as user input devices and user output devices, not all of which are shown.

Visual content generation system 900 can also include a merging system 960 that merges live footage with animated content. The live footage might be obtained and input by reading from live action footage storage 920 to obtain live action footage, by reading from live action metadata storage 924 to obtain details such as presumed segmentation in captured images segmenting objects in a live action scene from their background (perhaps aided by the fact that green screen 910 was part of the live action scene), and by obtaining CGI imagery from rendering engine 950.

A merging system 960 might also read data from rulesets for merging/combining storage 962. A very simple example of a rule in a ruleset might be "obtain a full image including a two-dimensional pixel array from live footage, obtain a full image including a two-dimensional pixel array from rendering engine 950, and output an image where each pixel is a corresponding pixel from rendering engine 950 when the corresponding pixel in the live footage is a specific color of green, otherwise output a pixel value from the corresponding pixel in the live footage."

Merging system 960 might include computer processing capabilities, image processing capabilities, one or more processors, program code storage for storing program instructions executable by the one or more processors, as well as user input devices and user output devices, not all of which are shown. Merging system 960 might operate autonomously, following programming instructions, or might have a user interface or programmatic interface over which an operator can control a merging process. In some implementations, an operator can specify parameter values to use in a merging process and/or might specify specific tweaks to be made to an output of merging system 960, such as modifying boundaries of segmented objects, inserting blurs to smooth out imperfections, or adding other effects. Based on its inputs, merging system 960 can output an image to be stored in a static image storage 970 and/or a sequence of images in the form of video to be stored in an animated/combined video storage 972.

Thus, as described, visual content generation system 900 can be used to generate video that combines live action with computer-generated animation using various components and tools, some of which are described in more detail herein. While visual content generation system 900 might be useful for such combinations, with suitable settings, it can be used for outputting entirely live action footage or entirely CGI sequences. The code may also be provided and/or carried by a transitory computer readable medium, e.g., a transmission medium such as in the form of a signal transmitted over a network.

According to one implementation, the techniques described herein are implemented by one or more generalized computing systems programmed to perform the techniques pursuant to program instructions in firmware, memory, other storage, or a combination. Special-purpose computing devices may be used, such as desktop computer systems, portable computer systems, handheld devices, networking devices or any other device that incorporates hard-wired and/or program logic to implement the techniques.

One implementation might include a carrier medium carrying image data or other data having details generated using the methods described herein. The carrier medium can comprise any medium suitable for carrying the image data or other data, including a storage medium, e.g., solid-state memory, an optical disk or a magnetic disk, or a transient medium, e.g., a signal carrying the image data such as a signal transmitted over a network, a digital signal, a radio frequency signal, an acoustic signal, an optical signal or an electrical signal.

Figure 10:
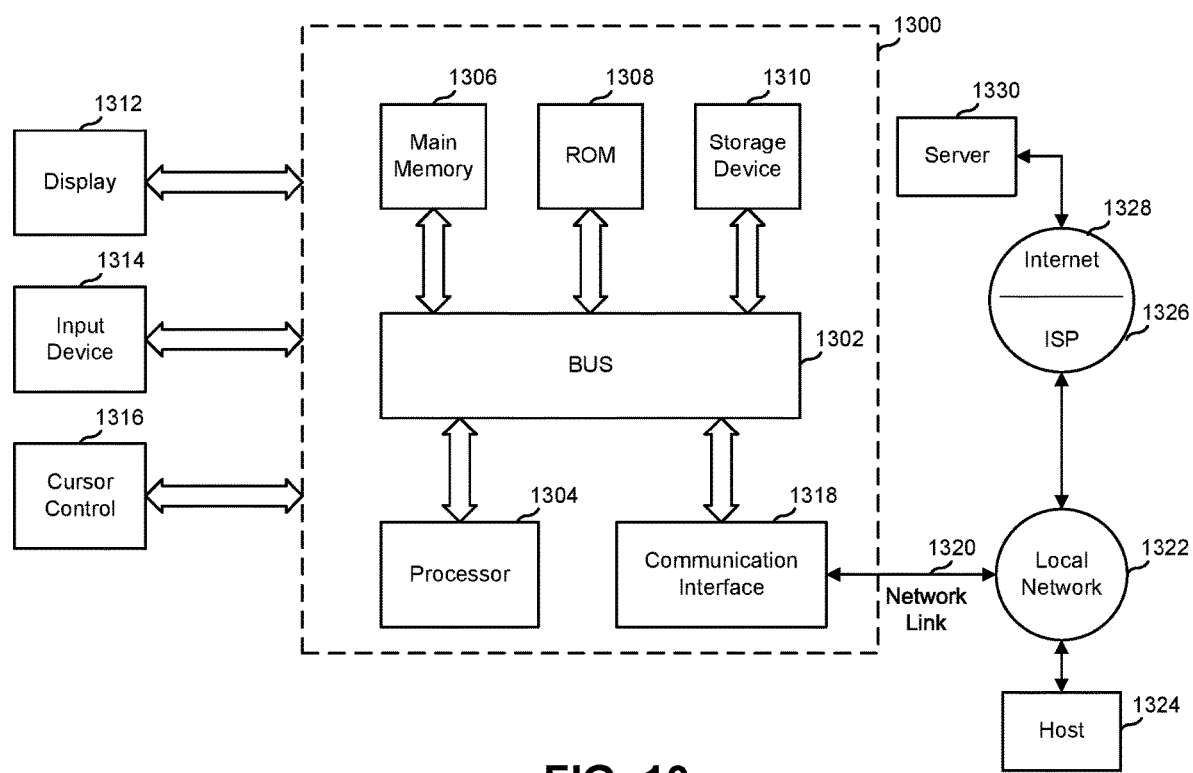
FIG. 10 is a block diagram illustrating an example computer system upon which computer systems of the systems illustrated in FIGS. 1 and 9 may be implemented.

FIG. 10 is a block diagram that illustrates a computer system 1000 upon which the computer systems of the systems described herein and/or visual content generation system 900 (see FIG. 9) may be implemented. Computer system 1000 includes a bus 1002 or other communication mechanism for communicating information, and a processor 1004 coupled with bus 1002 for processing information. Processor 1004 may be, for example, a general-purpose microprocessor.

Computer system 1000 also includes a main memory 1006, such as a random-access memory (RAM) or other dynamic storage device, coupled to bus 1002 for storing information and instructions to be executed by processor 1004. Main memory 1006 may also be used for storing temporary variables or other intermediate information during execution of instructions to be executed by processor 1004. Such instructions, when stored in non-transitory storage media accessible to processor 1004, render computer system 1000 into a special-purpose machine that is customized to perform the operations specified in the instructions.

Computer system 1000 further includes a read only memory (ROM) 1008 or other static storage device coupled to bus 1002 for storing static information and instructions for processor 1004. A storage device 1010, such as a magnetic disk or optical disk, is provided and coupled to bus 1002 for storing information and instructions.

Computer system 1000 may be coupled via bus 1002 to a display 1012, such as a computer monitor, for displaying information to a computer user. An input device 1014, including alphanumeric and other keys, is coupled to bus 1002 for communicating information and command selections to processor 1004. Another type of user input device is a cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane.

Computer system 1000 may implement the techniques described herein using customized hard-wired logic, one or more ASICs or FPGAs, firmware and/or program logic which in combination with the computer system causes or programs computer system 1000 to be a special-purpose machine. According to one implementation, the techniques herein are performed by computer system 1000 in response to processor 1004 executing one or more sequences of one or more instructions contained in main memory 1006. Such instructions may be read into main memory 1006 from another storage medium, such as storage device 1010. Execution of the sequences of instructions contained in main memory 1006 causes processor 1004 to perform the process steps described herein. In alternative implementations, hard-wired circuitry may be used in place of or in combination with software instructions.

The term "storage media" as used herein refers to any non-transitory media that store data and/or instructions that cause a machine to operation in a specific fashion. Such storage media may include non-volatile media and/or volatile media. Non-volatile media includes, for example, optical or magnetic disks, such as storage device 1010. Volatile media includes dynamic memory, such as main memory 1006. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, an EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire, and fiber optics, including the wires that include bus 1002. Transmission media can also take the form of acoustic or light waves, such as those generated during radio-wave and infra-red data communications.

Various forms of media may be involved in carrying one or more sequences of one or more instructions to processor 1004 for execution. For example, the instructions may initially be carried on a magnetic disk or solid-state drive of a remote computer. The remote computer can load the instructions into its dynamic memory and send the instructions over a network connection. A modem or network interface local to computer system 1000 can receive the data. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also includes a communication interface 1018 coupled to bus 1002. Communication interface 1018 provides a two-way data communication coupling to a network link 1020 that is connected to a local network 1022. For example, communication interface 1018 may be a network card, a modem, a cable modem, or a satellite modem to provide a data communication connection to a corresponding type of telephone line or communications line. Wireless links may also be implemented. In any such implementation, communication interface 1018 sends and receives electrical, electromagnetic, or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the world-wide packet data communication network now commonly referred to as the "Internet" 1028. Local network 1022 and Internet 1028 both use electrical, electromagnetic, or optical signals that carry digital data streams. The signals through the various networks and the signals on network link 1020 and through communication interface 1018, which carry the digital data to and from computer system 1000, are example forms of transmission media.

Computer system 1000 can send messages and receive data, including program code, through the network(s), network link 1020, and communication interface 1018. In the Internet example, a server 1030 might transmit a requested code for an application program through the Internet 1028, ISP 1026, local network 1022, and communication interface 1018. The received code may be executed by processor 1004 as it is received, and/or stored in storage device 1010, or other non-volatile storage for later execution.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. The code may also be provided carried by a transitory computer readable medium e.g., a transmission medium such as in the form of a signal transmitted over a network.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain implementations require at least one of A, at least one of B and at least one of C each to be present.

The use of examples, or exemplary language (e.g., "such as") provided herein, is intended merely to better illuminate implementations of the invention and does not pose a limitation on the scope of the invention unless otherwise claimed. No language in the specification should be construed as indicating any non-claimed element as essential to the practice of the invention.

In the foregoing specification, implementations of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

Further implementations can be envisioned to one of ordinary skill in the art after reading this disclosure. In other implementations, combinations or sub-combinations of the above-disclosed invention can be advantageously made. The example arrangements of components are shown for purposes of illustration and combinations, additions, re-arrangements, and the like are contemplated in alternative implementations of the present invention. Thus, while the invention has been described with respect to exemplary implementations, one skilled in the art will recognize that numerous modifications are possible.

For example, the processes described herein may be implemented using hardware components, software components, and/or any combination thereof. The specification and drawings are, accordingly, to be regarded in an illustrative rather than a restrictive sense. It will, however, be evident that various modifications and changes may be made thereunto without departing from the broader spirit and scope of the invention as set forth in the claims and that the invention is intended to cover all modifications and equivalents within the scope of the following claims.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method for modifying virtual objects in an image generation system, wherein the virtual objects are defined relative to a coordinate system of a virtual space, the method comprising:

defining a set of deformation handles, wherein a deformation handle of the set of deformation handles has an associated set of one or more control parameters, wherein a pose state data structure having stored values for control parameters of the associated set of one or more control parameters defines a pose state for the set of deformation handles;

obtaining a set of object points representative of a virtual object, wherein a number of object points in the set of object points is greater than a number of the set of deformation handles;

mapping the set of object points to a key pose state, wherein the key pose state is represented by a key pose state data structure corresponding to a key pose that specifies control parameters to place the set of deformation handles to coincide with the set of object points, and wherein coincidence between the set of deformation handles and the set of object points is within an artist-specified tolerance;

determining a plurality of key pose states and corresponding key pose state data structures, wherein the plurality of key pose states includes the key pose state represented by the key pose state data structure;

receiving a set of deformations to be applied to the set of deformation handles;

interpolating poses among an interpolated key pose state set, the interpolated key pose state set comprising at least two of the plurality of key pose states, to form a current pose state based on the set of deformations; and adjusting the virtual object based on the interpolated key pose state set.

2. The computer-implemented method of claim 1, wherein the set of object points representative of the virtual object are points on a surface of the virtual object.

3. The computer-implemented method of claim 1, wherein the set of object points representative of the virtual object are points relative to a surface of the virtual object.

4. The computer-implemented method of claim 3, wherein the points relative to the surface of the virtual object are points on a level set of the coordinate system relative to the surface of the virtual object.

5. The computer-implemented method of claim 1, wherein the set of object points representative of the virtual object are points of a point cloud representing the virtual object.

6. The computer-implemented method of claim 1, wherein the set of object points representative of the virtual object are points of a mesh representing the virtual object.

7. The computer-implemented method of claim 1, wherein the set of object points representative of the virtual object comprises points of a non-uniform rational B-spline (NURBS) corresponding to a surface of the virtual object.

8. The computer-implemented method of claim 1, wherein the pose state data structure comprises values for deformation handle parameters of a corresponding pose.

9. The computer-implemented method of claim 8, wherein the associated set of one or more control parameters for the deformation handle includes bind weight function values, the bind weight function values indicative of changes to positions of points in the set of object points resulting in changes of the associated set of one or more control parameters.

10. The computer-implemented method of claim 1, wherein interpolating poses comprises a weighted interpolation of the poses in the interpolated key pose state set.

11. The computer-implemented method of claim 1, wherein interpolating poses comprises a weighted interpolation of pose state data structures of the poses in the interpolated key pose state set.

12. The computer-implemented method of claim 1, wherein the set of deformations received are received via an artist user interface.

13. The computer-implemented method of claim 1, wherein the set of deformations received are derived, at least in part, as the result of programmatic computations and/or a computer simulation.

14. The computer-implemented method of claim 1, wherein the set of deformations received are derived, at least in part, from performance capture data.

15. A graphical editing system, comprising a processor and a non-transitory computer memory storing instructions for:

modifying virtual objects for an image generation system, wherein the virtual objects are defined relative to a coordinate system of a virtual space;

defining a set of deformation handles, wherein a deformation handle of the set of deformation handles has an associated set of one or more control parameters, wherein a pose state data structure having stored values for control parameters of the associated set of one or more control parameters defines a pose state for the set of deformation handles;

obtaining a set of object points representative of a virtual object, wherein a number of object points in the set of object points is greater than a number of the set of deformation handles;

mapping the set of object points to a key pose state, wherein the key pose state is represented by a key pose state data structure corresponding to a key pose that specifies control parameters to place the set of deformation handles to coincide with the set of object points, and wherein coincidence between the set of deformation handles and the set of object points is within an artist-specified tolerance;

determining a plurality of key pose states and corresponding key pose state data structures, wherein the plurality of key pose states includes the key pose state represented by the key pose state data structure;

receiving a set of deformations to be applied to the set of deformation handles;

interpolating poses among an interpolated key pose state set, the interpolated key pose state set comprising at least two of the plurality of key pose states, to form a current pose state based on the set of deformations; and adjusting the virtual object based on the interpolated key pose state set.

16. The graphical editing system of claim 15, wherein the set of object points representative of the virtual object are points on a surface of the virtual object, points relative to the surface of the virtual object, points on a level set of the coordinate system relative to the surface of the virtual object, points of a point cloud representing the virtual object, points of a mesh representing the virtual object, and/or points of a non-uniform rational B-spline (NURBS) corresponding to the surface of the virtual object.

17. The graphical editing system of claim 15, wherein a pose state data structure comprises values for deformation handle parameters of a corresponding pose.

18. The graphical editing system of claim 15, wherein the associated set of one or more control parameters for the deformation handle includes bind weight function values, the bind weight function values indicative of changes to positions of points in the set of object points resulting in changes of the associated set of one or more control parameters.

19. The graphical editing system of claim 15, wherein interpolating poses comprises performing a weighted interpolation of the poses in the interpolated key pose state set and/or performing a weighted interpolation of pose state data structures of the poses in the interpolated key pose state set.

* * * * *